United States Patent
Alexander

(10) Patent No.: US 9,565,782 B2
(45) Date of Patent: Feb. 7, 2017

(54) FIELD REPLACEABLE POWER SUPPLY CARTRIDGE

(71) Applicant: Journée Lighting, Inc., Westlake Village, CA (US)

(72) Inventor: Clayton Alexander, Westlake Village, CA (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

(21) Appl. No.: 14/178,157

(22) Filed: Feb. 11, 2014

(65) Prior Publication Data

US 2014/0233193 A1    Aug. 21, 2014

Related U.S. Application Data

(60) Provisional application No. 61/765,257, filed on Feb. 15, 2013.

(51) Int. Cl.
*H05K 7/14* (2006.01)

(52) U.S. Cl.
CPC ................... *H05K 7/1455* (2013.01)

(58) Field of Classification Search
CPC .... H04M 1/0262; G02B 6/4246; G06F 1/188; G06F 1/184; H05K 7/1411
See application file for complete search history.

(56) References Cited

U.S. PATENT DOCUMENTS

| | | | |
|---|---|---|---|
| 2,430,472 A | 11/1947 | Evy | |
| D149,124 S | 3/1948 | Hewitt | |
| D152,113 S | 12/1948 | Mehr | |
| 2,458,967 A | 1/1949 | Wiedenhoeft | |
| 2,678,380 A | 5/1954 | Westby | |

(Continued)

FOREIGN PATENT DOCUMENTS

| | | | |
|---|---|---|---|
| CA | 2623604 A1 | 8/2009 | |
| CN | 1536686 A | 10/2004 | |

(Continued)

OTHER PUBLICATIONS

Acuity Brands, "Acuity Brands Introduces Luminaire for Tunable White Technology," downloaded from http://news.acuitybrands.com/US/acuity-brands-introduces-luminaires-with-tunable-white-technology/s/54ae242f-1222-4b8b-be0d-36637bde8cd2 on May 28, 2014, 2pp.

(Continued)

*Primary Examiner* — Hoa C Nguyen
(74) *Attorney, Agent, or Firm* — Jay M. Brown

(57) ABSTRACT

A field replaceable power supply cartridge is provided for coupling with a socket. The cartridge has a latch mechanism that can be actuated by the user to couple the cartridge to the socket, such that latches of the cartridge releasably engage recessed portions in the socket. The cartridge has a key feature that corresponds to a key feature on the socket, allowing the cartridge to be coupled to the socket in only one orientation, thereby preventing the incorrect electrical connection between the cartridge and the socket. The cartridge can have a multi-pin electrical connector for coupling to a corresponding connector on the socket. The socket can be a relatively short socket, where the electrical wires are bottom fed, or can be a relatively tall socket, where the electrical wires are side fed via one or more openings in the body of the socket.

27 Claims, 13 Drawing Sheets

(56) References Cited

U.S. PATENT DOCUMENTS

| | | |
|---|---|---|
| 2,702,378 A | 2/1955 | Talty |
| D191,734 S | 11/1961 | Daher |
| 3,040,170 A | 6/1962 | Chwan |
| 3,078,366 A | 2/1963 | Winkler |
| 3,120,929 A | 2/1964 | Henning |
| 3,220,471 A | 11/1965 | Coe |
| 3,247,368 A | 4/1966 | McHugh |
| 3,435,891 A | 4/1969 | Parrish |
| D214,582 S | 7/1969 | Routh |
| D217,096 S | 4/1970 | Birns |
| 3,538,321 A | 11/1970 | Longenecker |
| 3,639,751 A | 2/1972 | Pichel |
| 3,643,038 A | 2/1972 | Sato |
| D231,559 S | 4/1974 | Darling et al. |
| D234,712 S | 4/1975 | Kennedy et al. |
| 3,989,976 A | 11/1976 | Tabor |
| 4,090,210 A | 5/1978 | Wehling et al. |
| 4,091,444 A | 5/1978 | Mori |
| 4,138,716 A | 2/1979 | Muhlethaler et al. |
| D251,500 S | 4/1979 | Aigner |
| 4,258,413 A | 3/1981 | Mausser |
| 4,345,306 A | 8/1982 | Summey |
| 4,414,489 A | 11/1983 | Young |
| 4,420,207 A * | 12/1983 | Nishikawa ............ H01R 13/193 439/368 |
| 4,423,471 A | 12/1983 | Gordin et al. |
| 4,445,164 A | 4/1984 | Giles, III |
| 4,453,203 A | 6/1984 | Pate |
| 4,467,403 A | 8/1984 | May |
| 4,473,873 A | 9/1984 | Quiogue |
| 4,564,888 A | 1/1986 | Lewin |
| 4,578,742 A | 3/1986 | Klein |
| 4,580,859 A | 4/1986 | Frano |
| 4,609,979 A | 9/1986 | Kristofek |
| 4,674,015 A | 6/1987 | Smith |
| 4,727,648 A | 3/1988 | Savage |
| 4,733,335 A | 3/1988 | Serizawa |
| D296,717 S | 7/1988 | Kane et al. |
| 4,755,918 A | 7/1988 | Pristash |
| 4,757,431 A | 7/1988 | Cross |
| 4,761,721 A | 8/1988 | Willing |
| D300,876 S | 4/1989 | Sakai |
| 4,833,579 A | 5/1989 | Skegin |
| 4,837,927 A | 6/1989 | Savage |
| 4,870,327 A | 9/1989 | Jorgensen |
| 4,872,097 A | 10/1989 | Miller |
| 4,882,667 A | 11/1989 | Skegin |
| 4,918,497 A | 4/1990 | Edmond |
| D308,114 S | 5/1990 | Shemitz |
| D308,260 S | 5/1990 | Shemitz |
| 4,966,862 A | 10/1990 | Edmond |
| D315,030 S | 2/1991 | Jacobs et al. |
| D316,303 S | 4/1991 | Layne |
| D316,306 S | 4/1991 | Shemitz |
| 5,027,168 A | 6/1991 | Edmond |
| D319,512 S | 8/1991 | Lettenmayer |
| D322,862 S | 12/1991 | Miller |
| 5,087,212 A | 2/1992 | Hanami |
| D325,645 S | 4/1992 | Grange |
| 5,140,507 A | 8/1992 | Harwood |
| D330,944 S | 11/1992 | Wereley |
| 5,174,649 A | 12/1992 | Alston |
| 5,177,404 A | 1/1993 | Cohen et al. |
| 5,210,051 A | 5/1993 | Carter, Jr. |
| D336,536 S | 6/1993 | Shaanan et al. |
| 5,235,470 A | 8/1993 | Cheng |
| D340,514 S | 10/1993 | Liao |
| 5,253,152 A | 10/1993 | Yang et al. |
| 5,282,364 A | 2/1994 | Cech |
| 5,303,124 A | 4/1994 | Wrobel |
| 5,324,213 A | 6/1994 | Frantz |
| 5,325,281 A | 6/1994 | Harwood |
| D348,744 S | 7/1994 | Johnson et al. |
| 5,335,159 A | 8/1994 | Chen et al. |
| 5,337,225 A | 8/1994 | Brookman |
| 5,338,944 A | 8/1994 | Edmond et al. |
| 5,359,345 A | 10/1994 | Hunter |
| 5,367,229 A | 11/1994 | Yang |
| 5,381,323 A | 1/1995 | Osteen et al. |
| 5,387,901 A | 2/1995 | Hardt |
| 5,393,993 A | 2/1995 | Edmond et al. |
| 5,410,462 A | 4/1995 | Wolfe |
| 5,416,342 A | 5/1995 | Edmond et al. |
| 5,436,809 A | 7/1995 | Brassier |
| 5,440,466 A | 8/1995 | Belisle |
| 5,450,303 A | 9/1995 | Markiewicz et al. |
| 5,490,048 A | 2/1996 | Brassier |
| 5,504,665 A | 4/1996 | Osteen et al. |
| 5,515,253 A | 5/1996 | Sjobom |
| 5,516,390 A | 5/1996 | Tomita et al. |
| 5,523,589 A | 6/1996 | Edmond et al. |
| D373,437 S | 9/1996 | Kira |
| 5,584,574 A | 12/1996 | Haddad |
| 5,599,091 A | 2/1997 | Kira |
| 5,604,135 A | 2/1997 | Edmond et al. |
| 5,628,557 A | 5/1997 | Huang |
| 5,631,190 A | 5/1997 | Negley |
| 5,632,551 A | 5/1997 | Roney |
| 5,634,822 A | 6/1997 | Gunell |
| 5,655,832 A | 8/1997 | Pelka |
| 5,658,066 A | 8/1997 | Hirsch |
| D383,236 S | 9/1997 | Krogman |
| D384,336 S | 9/1997 | Gerber et al. |
| 5,676,453 A | 10/1997 | Parkyn, Jr. |
| D390,992 S | 2/1998 | Shemitz |
| 5,713,662 A | 2/1998 | Kira |
| 5,739,554 A | 4/1998 | Edmond et al. |
| 5,757,144 A * | 5/1998 | Nilssen ................ H05B 41/245 315/209 R |
| 5,788,533 A | 8/1998 | Alvarado-Rodriguez |
| 5,794,685 A | 8/1998 | Dean |
| 5,800,050 A | 9/1998 | Leadford |
| 5,806,955 A | 9/1998 | Parkyn, Jr. |
| D408,823 S | 4/1999 | Kirby |
| 5,890,793 A | 4/1999 | Stephens |
| 5,894,196 A | 4/1999 | McDermott |
| 5,898,267 A | 4/1999 | McDermott |
| 5,909,955 A | 6/1999 | Roorda |
| 5,912,477 A | 6/1999 | Negley |
| 5,938,316 A | 8/1999 | Yan |
| 6,022,130 A | 2/2000 | Donato |
| 6,051,940 A | 4/2000 | Arun |
| 6,072,160 A | 6/2000 | Bahl |
| 6,079,851 A | 6/2000 | Altman |
| 6,083,021 A | 7/2000 | Lau |
| 6,104,536 A | 8/2000 | Eckhardt |
| 6,120,600 A | 9/2000 | Edmond et al. |
| 6,124,673 A | 9/2000 | Bishop |
| 6,149,112 A | 11/2000 | Thieltges |
| 6,149,288 A | 11/2000 | Huang |
| 6,176,594 B1 | 1/2001 | Yarconi |
| D437,449 S | 2/2001 | Soller |
| D437,652 S | 2/2001 | Uhler |
| 6,187,606 B1 | 2/2001 | Edmond et al. |
| 6,198,233 B1 * | 3/2001 | McConaughy ........ H05B 41/02 315/209 R |
| 6,201,262 B1 | 3/2001 | Edmond et al. |
| D443,710 S | 6/2001 | Chiu |
| 6,244,877 B1 * | 6/2001 | Asao ................... H01R 9/2466 361/760 |
| 6,249,375 B1 | 6/2001 | Silhengst |
| D445,936 S | 7/2001 | Mier-Langner et al. |
| 6,260,981 B1 | 7/2001 | Fiene |
| D446,592 S | 8/2001 | Leen |
| 6,273,588 B1 | 8/2001 | Arakelian |
| D448,508 S | 9/2001 | Benghozi |
| 6,312,787 B1 | 11/2001 | Hayashi et al. |
| 6,318,883 B1 | 11/2001 | Sugiyama et al. |
| D452,843 S | 1/2002 | Henrici |
| 6,341,523 B2 | 1/2002 | Lynam |
| D457,673 S | 5/2002 | Martinson |
| 6,386,723 B1 | 5/2002 | Eberlein et al. |
| 6,390,646 B1 | 5/2002 | Yan |

(56) References Cited

U.S. PATENT DOCUMENTS

| | | | |
|---|---|---|---|
| 6,392,360 B2 * | 5/2002 | McConaughy | H05B 41/02 315/209 R |
| 6,426,704 B1 | 7/2002 | Hutchison | |
| 6,435,693 B1 | 8/2002 | Fiene | |
| 6,439,736 B1 | 8/2002 | Fiene | |
| 6,439,743 B1 | 8/2002 | Hutchison | |
| 6,439,749 B1 | 8/2002 | Miller et al. | |
| 6,441,943 B1 | 8/2002 | Roberts | |
| D462,801 S | 9/2002 | Huang | |
| 6,450,662 B1 | 9/2002 | Hutchison | |
| 6,450,664 B1 | 9/2002 | Kelly | |
| D464,455 S | 10/2002 | Fong | |
| D464,939 S | 10/2002 | Chuang | |
| D465,046 S | 10/2002 | Layne | |
| 6,473,002 B1 | 10/2002 | Hutchison | |
| 6,474,839 B1 | 11/2002 | Hutchison | |
| 6,478,453 B2 | 11/2002 | Lammers | |
| 6,488,386 B1 | 12/2002 | Yan | |
| 6,508,567 B1 | 1/2003 | Fiene | |
| D470,962 S | 2/2003 | Chen | |
| 6,525,939 B2 | 2/2003 | Liang | |
| D472,339 S | 3/2003 | Russello et al. | |
| 6,527,422 B1 | 3/2003 | Hutchison | |
| 6,530,674 B2 | 3/2003 | Grierson et al. | |
| D473,529 S | 4/2003 | Feinbloom | |
| 6,540,382 B1 | 4/2003 | Simon | |
| 6,561,690 B2 | 5/2003 | Balestriero et al. | |
| D476,439 S | 6/2003 | O'Rourke | |
| 6,600,175 B1 | 7/2003 | Baretz et al. | |
| 6,601,970 B2 | 8/2003 | Ueda | |
| 6,618,231 B2 | 9/2003 | McConaughy | |
| 6,632,006 B1 | 10/2003 | Rippel | |
| 6,636,003 B2 | 10/2003 | Rahm et al. | |
| D482,476 S | 11/2003 | Kwong | |
| 6,641,284 B2 | 11/2003 | Stopa et al. | |
| 6,662,211 B1 | 12/2003 | Weller | |
| 6,682,211 B2 | 1/2004 | English | |
| 6,683,419 B2 | 1/2004 | Kriparos | |
| 6,691,768 B2 | 2/2004 | Hsieh | |
| 6,703,640 B1 | 3/2004 | Hembree | |
| 6,733,164 B1 | 5/2004 | Smith, Jr. | |
| D491,306 S | 6/2004 | Zucker | |
| 6,744,693 B2 | 6/2004 | Brockmann | |
| 6,752,645 B2 * | 6/2004 | Nakamura | H01L 23/4093 257/E23.086 |
| 6,773,138 B2 | 8/2004 | Coushaine | |
| 6,787,999 B2 | 9/2004 | Stimac | |
| 6,788,510 B2 | 9/2004 | McConaughy | |
| 6,791,119 B2 | 9/2004 | Slater, Jr. et al. | |
| 6,814,462 B1 | 11/2004 | Fiene | |
| 6,824,296 B2 | 11/2004 | Souza | |
| 6,824,390 B2 | 11/2004 | Brown | |
| 6,827,469 B2 | 12/2004 | Coushaine | |
| 6,853,010 B2 | 2/2005 | Slater, Jr. et al. | |
| 6,860,617 B2 | 3/2005 | Fiene | |
| 6,863,424 B2 | 3/2005 | Smith | |
| 6,864,513 B2 | 3/2005 | Lin | |
| 6,869,206 B2 | 3/2005 | Zimmerman | |
| 6,871,993 B2 | 3/2005 | Hecht | |
| D504,967 S | 5/2005 | Kung | |
| 6,893,144 B2 | 5/2005 | Fan | |
| D506,065 S | 6/2005 | Sugino et al. | |
| 6,902,200 B1 | 6/2005 | Beadle | |
| 6,902,291 B2 | 6/2005 | Rizkin | |
| 6,903,380 B2 | 6/2005 | Barnett | |
| 6,905,232 B2 | 6/2005 | Lin | |
| 6,946,806 B1 | 9/2005 | Choi | |
| 6,958,497 B2 | 10/2005 | Emerson et al. | |
| 6,966,677 B2 | 11/2005 | Galli | |
| 6,979,097 B2 | 12/2005 | Elam et al. | |
| D516,020 S | 2/2006 | Wong et al. | |
| D516,229 S | 2/2006 | Tang | |
| 6,998,650 B1 | 2/2006 | Wu | |
| 7,040,774 B2 | 5/2006 | Beeson et al. | |
| 7,063,130 B2 | 6/2006 | Huang | |
| 7,063,440 B2 | 6/2006 | Mohacsi et al. | |
| 7,066,617 B2 | 6/2006 | Mandy et al. | |
| D524,975 S | 7/2006 | Oas | |
| 7,070,301 B2 | 7/2006 | Magarill | |
| 7,077,546 B2 | 7/2006 | Yamauchi | |
| D527,119 S | 8/2006 | Maxik | |
| D527,131 S | 8/2006 | McCarthy, III | |
| 7,093,958 B2 | 8/2006 | Coushaine | |
| 7,095,056 B2 | 8/2006 | Vitta et al. | |
| 7,097,332 B2 | 8/2006 | Vamberi | |
| 7,098,397 B2 * | 8/2006 | Lange | H02G 3/14 174/50 |
| 7,111,963 B2 | 9/2006 | Zhang | |
| 7,111,971 B2 | 9/2006 | Coushaine | |
| 7,112,916 B2 | 9/2006 | Goh | |
| D530,683 S | 10/2006 | Rivas | |
| 7,131,749 B2 | 11/2006 | Wimberly | |
| 7,132,804 B2 | 11/2006 | Lys | |
| 7,138,667 B2 | 11/2006 | Barnett | |
| 7,149,089 B2 * | 12/2006 | Blasko | H01R 13/521 361/752 |
| 7,150,553 B2 | 12/2006 | English | |
| D535,774 S | 1/2007 | Weston et al. | |
| 7,159,997 B2 | 1/2007 | Reo et al. | |
| 7,160,004 B2 | 1/2007 | Peck | |
| 7,172,319 B2 | 2/2007 | Holder et al. | |
| D538,951 S | 3/2007 | Maxik | |
| D539,459 S | 3/2007 | Benghozi | |
| 7,198,386 B2 | 4/2007 | Zampini | |
| 7,207,696 B1 | 4/2007 | Lin | |
| D541,957 S | 5/2007 | Wang | |
| 7,210,957 B2 | 5/2007 | Mrakovich et al. | |
| 7,213,940 B1 | 5/2007 | Van De Ven et al. | |
| 7,221,374 B2 | 5/2007 | Dixon | |
| D544,110 S | 6/2007 | Hooker | |
| D545,457 S | 6/2007 | Chen | |
| 7,234,950 B1 * | 6/2007 | Wickett | H01R 13/504 439/247 |
| 7,237,930 B2 | 7/2007 | Onishi et al. | |
| D548,691 S | 8/2007 | Krieger et al. | |
| 7,273,299 B2 | 9/2007 | Parkyn et al. | |
| D552,779 S | 10/2007 | Starck | |
| 7,282,840 B2 | 10/2007 | Chih | |
| 7,286,296 B2 | 10/2007 | Chaves | |
| 7,288,902 B1 | 10/2007 | Melanson | |
| 7,293,908 B2 | 11/2007 | Beeson et al. | |
| 7,303,301 B2 | 12/2007 | Koren | |
| D561,924 S | 2/2008 | Yiu | |
| D563,013 S | 2/2008 | Levine | |
| 7,329,907 B2 | 2/2008 | Pang et al. | |
| D564,119 S | 3/2008 | Metlen | |
| 7,344,279 B2 | 3/2008 | Mueller | |
| 7,344,296 B2 | 3/2008 | Matsui | |
| 7,357,534 B2 | 4/2008 | Snyder | |
| 7,358,657 B2 | 4/2008 | Koelger | |
| 7,358,679 B2 | 4/2008 | Lys et al. | |
| 7,360,925 B2 | 4/2008 | Coushaine | |
| D568,829 S | 5/2008 | Yamashita | |
| 7,369,386 B2 | 5/2008 | Rasmussen | |
| D570,505 S | 6/2008 | Maxik | |
| 7,381,942 B2 | 6/2008 | Chin et al. | |
| D574,095 S | 7/2008 | Hill | |
| 7,396,139 B2 | 7/2008 | Savage | |
| 7,396,146 B2 | 7/2008 | Wang | |
| 7,413,326 B2 | 8/2008 | Tain | |
| D576,545 S | 9/2008 | Mandel et al. | |
| D576,964 S | 9/2008 | Shaner | |
| D577,453 S | 9/2008 | Metlen | |
| D577,836 S | 9/2008 | Engebrigtsen | |
| 7,422,347 B2 | 9/2008 | Miyairi et al. | |
| D579,421 S | 10/2008 | Chu | |
| D581,080 S | 11/2008 | Mier-Langner | |
| D581,554 S | 11/2008 | To | |
| D581,583 S | 11/2008 | Peng | |
| 7,452,115 B2 | 11/2008 | Alcelik | |
| 7,456,499 B2 | 11/2008 | Loh et al. | |
| D583,975 S | 12/2008 | Kushinskaya et al. | |
| 7,458,820 B2 * | 12/2008 | Ohta | G01R 1/0483 439/331 |

(56) References Cited

U.S. PATENT DOCUMENTS

| | | | |
|---|---|---|---|
| 7,467,888 B2 * | 12/2008 | Fiene | H01R 31/065 362/221 |
| D585,588 S | 1/2009 | Alexander | |
| D585,589 S | 1/2009 | Alexander | |
| 7,481,552 B2 | 1/2009 | Mayfield, III et al. | |
| D586,498 S | 2/2009 | Wu | |
| D587,389 S | 2/2009 | Benensohn | |
| 7,494,248 B2 | 2/2009 | Li | |
| 7,497,581 B2 | 3/2009 | Beeson et al. | |
| 7,513,675 B2 | 4/2009 | Mier-Langner et al. | |
| D591,894 S | 5/2009 | Flank | |
| D592,799 S | 5/2009 | Scott | |
| 7,532,324 B2 | 5/2009 | Liu et al. | |
| 7,537,464 B2 * | 5/2009 | Brandenburg | H01R 4/2404 439/76.1 |
| 7,539,028 B2 | 5/2009 | Baurle et al. | |
| D593,512 S | 6/2009 | Lin | |
| 7,540,761 B2 | 6/2009 | Weber | |
| 7,549,786 B2 | 6/2009 | Higley | |
| D597,246 S | 7/2009 | Meyer, IV | |
| D597,247 S | 7/2009 | Meyer, IV | |
| 7,559,784 B2 * | 7/2009 | Hsiao | H05K 7/1053 439/331 |
| 7,564,180 B2 | 7/2009 | Brandes | |
| D597,704 S | 8/2009 | Peng | |
| D599,040 S | 8/2009 | Alexander | |
| 7,575,332 B2 | 8/2009 | Cok | |
| 7,575,338 B1 | 8/2009 | Verfuerth | |
| 7,580,192 B1 | 8/2009 | Chu | |
| D601,276 S | 9/2009 | Grajcar | |
| 7,591,572 B1 | 9/2009 | Levine | |
| 7,594,738 B1 | 9/2009 | Lin et al. | |
| D602,868 S | 10/2009 | Vogt | |
| 7,604,365 B2 | 10/2009 | Chang | |
| 7,607,802 B2 | 10/2009 | Kang | |
| 7,621,770 B1 | 11/2009 | Finizio | |
| 7,626,345 B2 | 12/2009 | Young | |
| 7,628,506 B2 | 12/2009 | Verfuerth et al. | |
| 7,637,635 B2 | 12/2009 | Xiao | |
| D608,043 S | 1/2010 | Ko | |
| D610,543 S | 2/2010 | Coushaine | |
| D610,723 S | 2/2010 | Grajcar | |
| D610,729 S | 2/2010 | Kushinskaya et al. | |
| 7,665,862 B2 | 2/2010 | Villard | |
| 7,674,018 B2 | 3/2010 | Holder et al. | |
| 7,679,281 B2 | 3/2010 | Kim et al. | |
| 7,686,481 B1 | 3/2010 | Condon et al. | |
| 7,690,810 B2 | 4/2010 | Saitoh et al. | |
| 7,703,951 B2 | 4/2010 | Piepgras | |
| 7,722,227 B2 | 5/2010 | Zhang | |
| 7,727,009 B2 | 6/2010 | Goto | |
| 7,731,395 B2 | 6/2010 | Parkyn et al. | |
| 7,731,396 B2 | 6/2010 | Fay | |
| 7,736,029 B2 | 6/2010 | Chen et al. | |
| 7,737,634 B2 | 6/2010 | Leng et al. | |
| 7,740,380 B2 | 6/2010 | Thrailkill | |
| 7,744,259 B2 | 6/2010 | Walczak | |
| 7,744,266 B2 | 6/2010 | Higley | |
| 7,748,870 B2 | 7/2010 | Chang | |
| 7,759,881 B1 | 7/2010 | Melanson | |
| 7,766,508 B2 | 8/2010 | Villard et al. | |
| 7,766,518 B2 | 8/2010 | Piepgras | |
| 7,784,966 B2 | 8/2010 | Verfuerth et al. | |
| 7,785,124 B2 * | 8/2010 | Lin | G01R 1/0458 439/330 |
| D625,870 S | 10/2010 | Feigenbaum | |
| D626,094 S | 10/2010 | Alexander | |
| 7,806,562 B2 | 10/2010 | Behr | |
| 7,810,951 B1 | 10/2010 | Lee et al. | |
| 7,810,955 B2 | 10/2010 | Stimac et al. | |
| 7,810,995 B2 | 10/2010 | Fadler et al. | |
| 7,813,111 B2 | 10/2010 | Anderson | |
| 7,819,549 B2 | 10/2010 | Narendran et al. | |
| D627,507 S | 11/2010 | Lai | |
| D627,727 S | 11/2010 | Alexander | |
| D628,156 S | 11/2010 | Alexander | |
| 7,828,576 B2 * | 11/2010 | Lin | G01R 1/0466 439/331 |
| 7,837,348 B2 | 11/2010 | Narendran et al. | |
| 7,841,753 B2 | 11/2010 | Liu | |
| D629,365 S | 12/2010 | Garcia De Vicuna | |
| 7,845,393 B2 | 12/2010 | Kao | |
| 7,857,482 B2 | 12/2010 | Reo et al. | |
| 7,857,498 B2 | 12/2010 | Smith | |
| 7,866,850 B2 | 1/2011 | Alexander | |
| 7,874,700 B2 | 1/2011 | Patrick | |
| D633,244 S | 2/2011 | Kramer et al. | |
| D633,248 S | 2/2011 | Alexander | |
| 7,889,421 B2 | 2/2011 | Narendran | |
| 7,896,517 B2 | 3/2011 | Mandy et al. | |
| 7,901,108 B2 | 3/2011 | Kabuki et al. | |
| 7,914,162 B1 | 3/2011 | Huang | |
| 7,914,198 B2 | 3/2011 | Mier-Langner et al. | |
| 7,918,581 B2 | 4/2011 | Van De Ven | |
| 7,918,589 B2 | 4/2011 | Mayfield, III et al. | |
| 7,922,364 B2 | 4/2011 | Tessnow | |
| 7,923,907 B2 | 4/2011 | Tessnow | |
| 7,942,559 B2 | 5/2011 | Holder et al. | |
| 7,952,114 B2 | 5/2011 | Gingrich, III | |
| 7,965,494 B1 | 6/2011 | Morris et al. | |
| 7,972,038 B2 | 7/2011 | Albright | |
| 7,972,054 B2 | 7/2011 | Alexander | |
| 7,976,194 B2 | 7/2011 | Wilcox et al. | |
| 7,985,005 B2 | 7/2011 | Alexander | |
| 7,988,336 B1 | 8/2011 | Harbers | |
| 7,993,031 B2 | 8/2011 | Grajcar | |
| 8,002,438 B2 | 8/2011 | Ko | |
| 8,007,131 B2 | 8/2011 | Liu et al. | |
| D645,007 S | 9/2011 | Alexander | |
| D645,594 S | 9/2011 | Grawe | |
| 8,021,008 B2 | 9/2011 | Ramer | |
| 8,029,157 B2 | 10/2011 | Li et al. | |
| 8,033,680 B2 | 10/2011 | Sharrah | |
| 8,052,310 B2 | 11/2011 | Gingrich, III | |
| 8,066,403 B2 | 11/2011 | Sanfilippo et al. | |
| D650,504 S | 12/2011 | Kim et al. | |
| D650,935 S | 12/2011 | Beghelli | |
| 8,080,819 B2 | 12/2011 | Mueller et al. | |
| 8,083,364 B2 | 12/2011 | Allen | |
| 8,096,668 B2 | 1/2012 | Abu-Ageel | |
| 8,100,560 B2 | 1/2012 | Ahland, III et al. | |
| 8,100,564 B2 | 1/2012 | Ono | |
| 8,102,167 B2 | 1/2012 | Irissou et al. | |
| 8,102,683 B2 | 1/2012 | Gaknoki et al. | |
| D654,607 S | 2/2012 | Kim et al. | |
| 8,118,450 B2 | 2/2012 | Villard | |
| 8,118,454 B2 | 2/2012 | Rains, Jr. et al. | |
| 8,123,376 B2 | 2/2012 | Van De Ven et al. | |
| 8,125,776 B2 | 2/2012 | Alexander | |
| D655,432 S | 3/2012 | Beghelli | |
| D655,840 S | 3/2012 | Heaton et al. | |
| D655,842 S | 3/2012 | Sabernig | |
| 8,129,669 B2 | 3/2012 | Chen et al. | |
| 8,136,958 B2 | 3/2012 | Verfuerth et al. | |
| 8,138,690 B2 | 3/2012 | Chemel et al. | |
| 8,142,047 B2 | 3/2012 | Acampora et al. | |
| 8,143,803 B2 | 3/2012 | Beij et al. | |
| 8,152,336 B2 | 4/2012 | Alexander | |
| 8,154,864 B1 | 4/2012 | Nearman | |
| 8,162,498 B2 | 4/2012 | Ramer et al. | |
| D659,871 S | 5/2012 | Lee et al. | |
| D660,229 S | 5/2012 | Tseng | |
| 8,172,425 B2 | 5/2012 | Wen et al. | |
| 8,172,436 B2 | 5/2012 | Coleman | |
| 8,177,395 B2 | 5/2012 | Alexander | |
| 8,182,122 B2 | 5/2012 | Chiu | |
| 8,191,613 B2 | 6/2012 | Yuan | |
| 8,193,738 B2 | 6/2012 | Chu et al. | |
| 8,201,965 B2 | 6/2012 | Yamada et al. | |
| 8,205,998 B2 | 6/2012 | Ramer et al. | |
| 8,210,722 B2 | 7/2012 | Holder et al. | |
| 8,212,469 B2 | 7/2012 | Rains, Jr. et al. | |
| 8,215,798 B2 | 7/2012 | Rains, Jr. et al. | |
| 8,232,745 B2 | 7/2012 | Chemel et al. | |

(56) References Cited

U.S. PATENT DOCUMENTS

| | | |
|---|---|---|
| D665,340 S | 8/2012 | Obata |
| 8,242,766 B2 | 8/2012 | Gaknoki et al. |
| 8,292,482 B2 | 10/2012 | Harbers |
| 8,297,788 B2 | 10/2012 | Bishop |
| 8,297,792 B1 | 10/2012 | Wang |
| 8,297,808 B2 | 10/2012 | Yuan |
| 8,319,437 B2 | 11/2012 | Carlin et al. |
| 8,324,838 B2 | 12/2012 | Shah et al. |
| 8,330,378 B2 | 12/2012 | Maehara et al. |
| 8,337,043 B2 | 12/2012 | Verfuerth et al. |
| 8,344,602 B2 * | 1/2013 | Lai .................... F21V 19/0025 313/46 |
| 8,360,609 B2 | 1/2013 | Lee et al. |
| 8,360,621 B2 | 1/2013 | Avila et al. |
| 8,385,071 B2 | 2/2013 | Lin |
| 8,403,541 B1 | 3/2013 | Rashidi |
| 8,410,716 B2 | 4/2013 | Yao et al. |
| 8,414,178 B2 | 4/2013 | Alexander |
| 8,434,898 B2 | 5/2013 | Sanfilippo et al. |
| 8,436,556 B2 | 5/2013 | Eisele et al. |
| 8,454,193 B2 | 6/2013 | Simon et al. |
| 8,459,841 B2 | 6/2013 | Huang |
| 8,462,523 B2 | 6/2013 | Gaknoki et al. |
| 8,469,542 B2 | 6/2013 | Zampini, II et al. |
| 8,503,083 B2 | 8/2013 | Seo |
| 8,529,102 B2 | 9/2013 | Pickard et al. |
| 8,531,134 B2 | 9/2013 | Chemel et al. |
| 8,536,802 B2 | 9/2013 | Chemel et al. |
| 8,536,805 B2 | 9/2013 | Shah et al. |
| 8,543,249 B2 | 9/2013 | Chemel et al. |
| D690,859 S | 10/2013 | Mollaghaffari |
| 8,545,045 B2 | 10/2013 | Tress |
| 8,545,049 B2 | 10/2013 | Davis et al. |
| 8,547,034 B2 | 10/2013 | Melanson et al. |
| 8,552,664 B2 | 10/2013 | Chemel et al. |
| 8,556,469 B2 | 10/2013 | Pickard |
| 8,558,518 B2 | 10/2013 | Irissou et al. |
| 8,562,180 B2 | 10/2013 | Alexander |
| 8,569,972 B2 | 10/2013 | Melanson |
| 8,573,807 B2 | 11/2013 | Borkar et al. |
| 8,573,816 B2 | 11/2013 | Negley et al. |
| 8,575,858 B2 | 11/2013 | Policy et al. |
| 8,579,467 B1 | 11/2013 | Szeto |
| 8,581,504 B2 | 11/2013 | Kost et al. |
| 8,581,521 B2 | 11/2013 | Welten et al. |
| 8,585,245 B2 | 11/2013 | Black et al. |
| 8,587,211 B2 | 11/2013 | Melanson |
| 8,593,074 B2 | 11/2013 | Hatley et al. |
| 8,593,129 B2 | 11/2013 | Gaknoki et al. |
| 8,593,814 B2 | 11/2013 | Ji |
| D694,925 S | 12/2013 | Fukasawa |
| 8,598,809 B2 | 12/2013 | Negley et al. |
| 8,602,591 B2 | 12/2013 | Lee |
| 8,610,364 B2 | 12/2013 | Melanson et al. |
| 8,610,365 B2 | 12/2013 | King et al. |
| 8,611,106 B2 | 12/2013 | Fang |
| 8,616,724 B2 | 12/2013 | Pickard |
| 8,624,505 B2 | 1/2014 | Huang |
| D699,179 S | 2/2014 | Alexander |
| 8,643,038 B2 | 2/2014 | Collins |
| 8,646,944 B2 | 2/2014 | Villard |
| 8,646,949 B2 | 2/2014 | Brunt, Jr. et al. |
| 8,652,357 B2 | 2/2014 | Ryu |
| 8,653,750 B2 | 2/2014 | Deurenberg et al. |
| D700,728 S | 3/2014 | Fukasawa |
| 8,684,556 B2 | 4/2014 | Negley et al. |
| 8,684,569 B2 | 4/2014 | Pickard et al. |
| 8,690,383 B2 | 4/2014 | Zampini, II et al. |
| 8,698,421 B2 | 4/2014 | Ludorf |
| D704,369 S | 5/2014 | Lindsley et al. |
| 8,723,427 B2 | 5/2014 | Collins et al. |
| 8,740,444 B2 | 6/2014 | Reynolds et al. |
| 8,742,684 B2 | 6/2014 | Melanson |
| 8,749,131 B2 | 6/2014 | Rains, Jr. et al. |
| 8,749,173 B1 | 6/2014 | Melanson et al. |
| 8,757,840 B2 | 6/2014 | Pickard et al. |
| 8,760,073 B2 | 6/2014 | Ko |
| 8,760,080 B2 | 6/2014 | Yu |
| 8,764,225 B2 | 7/2014 | Narendran et al. |
| 8,777,455 B2 | 7/2014 | Pickard et al. |
| 8,783,938 B2 | 7/2014 | Alexander |
| 8,786,201 B2 | 7/2014 | Hamamoto et al. |
| 8,786,210 B2 | 7/2014 | Delucia |
| 8,786,211 B2 | 7/2014 | Gilliom |
| 8,786,212 B2 | 7/2014 | Terazawa |
| 8,786,213 B2 | 7/2014 | Yang et al. |
| 8,791,642 B2 | 7/2014 | Van De Ven |
| 8,794,792 B1 | 8/2014 | Moghal |
| 8,796,948 B2 | 8/2014 | Weaver |
| 8,810,227 B2 | 8/2014 | Flaibani et al. |
| 8,814,385 B2 | 8/2014 | Onaka et al. |
| 8,816,593 B2 | 8/2014 | Lys et al. |
| 8,820,964 B2 | 9/2014 | Gould |
| 8,836,226 B2 | 9/2014 | Mercier et al. |
| 8,840,278 B2 | 9/2014 | Pickard |
| 8,847,515 B2 | 9/2014 | King et al. |
| 8,853,958 B2 | 10/2014 | Athalye et al. |
| 8,858,028 B2 | 10/2014 | Kim |
| 8,876,322 B2 | 11/2014 | Alexander |
| 8,888,315 B2 | 11/2014 | Edwards et al. |
| 8,888,506 B2 * | 11/2014 | Nishimura .......... H01R 12/7082 439/74 |
| 8,901,838 B2 | 12/2014 | Akiyama et al. |
| 8,944,647 B2 | 2/2015 | Bueeler |
| D724,773 S | 3/2015 | Ryu |
| 8,970,101 B2 | 3/2015 | Sutardja |
| 9,010,967 B2 | 4/2015 | Jensen |
| 9,052,100 B2 | 6/2015 | Blackstone |
| 9,307,588 B2 | 4/2016 | Li |
| 2001/0006463 A1 | 7/2001 | Fischer |
| 2001/0053628 A1 * | 12/2001 | Hayakawa .......... G01R 1/0483 439/526 |
| 2002/0046826 A1 | 4/2002 | Kao |
| 2002/0067613 A1 | 6/2002 | Grove |
| 2002/0106925 A1 * | 8/2002 | Yamagishi .......... H05K 7/1007 439/331 |
| 2002/0117692 A1 | 8/2002 | Lin |
| 2003/0058658 A1 | 3/2003 | Lee |
| 2003/0072156 A1 | 4/2003 | Pohlert |
| 2003/0128543 A1 | 7/2003 | Rekow |
| 2003/0174517 A1 | 9/2003 | Kiraly et al. |
| 2003/0185005 A1 | 10/2003 | Sommers |
| 2003/0209963 A1 | 11/2003 | Altgilbers |
| 2004/0005800 A1 * | 1/2004 | Hou .................... H05K 7/10 439/342 |
| 2004/0090781 A1 | 5/2004 | Yeoh |
| 2004/0090784 A1 | 5/2004 | Ward |
| 2004/0212991 A1 | 10/2004 | Galli |
| 2004/0218372 A1 * | 11/2004 | Hamasaki ................ G02B 6/43 361/767 |
| 2005/0032402 A1 * | 2/2005 | Takanashi .............. B60T 8/3675 439/76.2 |
| 2005/0047170 A1 | 3/2005 | Hilburger |
| 2005/0083698 A1 | 4/2005 | Zampini |
| 2005/0122713 A1 | 6/2005 | Hutchins |
| 2005/0130336 A1 | 6/2005 | Collins, III |
| 2005/0146884 A1 | 7/2005 | Scheithauer |
| 2005/0174780 A1 | 8/2005 | Park |
| 2005/0205878 A1 | 9/2005 | Kan |
| 2005/0242362 A1 | 11/2005 | Shimizu |
| 2005/0269060 A1 | 12/2005 | Ku |
| 2005/0270775 A1 | 12/2005 | Harbers |
| 2005/0286265 A1 | 12/2005 | Zampini et al. |
| 2006/0001381 A1 | 1/2006 | Robinson |
| 2006/0039156 A1 | 2/2006 | Chen |
| 2006/0062019 A1 | 3/2006 | Young |
| 2006/0076672 A1 | 4/2006 | Petroski |
| 2006/0141851 A1 | 6/2006 | Matsui |
| 2006/0146422 A1 | 7/2006 | Koike |
| 2006/0146531 A1 | 7/2006 | Reo et al. |
| 2006/0152140 A1 | 7/2006 | Brandes |
| 2006/0221272 A1 | 10/2006 | Negley et al. |
| 2006/0262544 A1 | 11/2006 | Piepgras |
| 2006/0262545 A1 | 11/2006 | Piepgras |

(56) References Cited

U.S. PATENT DOCUMENTS

| | | |
|---|---|---|
| 2007/0025103 A1 | 2/2007 | Chan |
| 2007/0064428 A1 | 3/2007 | Beauchamp |
| 2007/0096057 A1 | 5/2007 | Hampden-Smith |
| 2007/0109795 A1 | 5/2007 | Gabrius |
| 2007/0139923 A1 | 6/2007 | Negley et al. |
| 2007/0153521 A1 | 7/2007 | Konuma |
| 2007/0158668 A1 | 7/2007 | Tarsa et al. |
| 2007/0170447 A1 | 7/2007 | Negley et al. |
| 2007/0223219 A1 | 9/2007 | Medendorp, Jr. |
| 2007/0238327 A1* | 10/2007 | Hsu ............ H05K 7/1069 439/70 |
| 2007/0242461 A1 | 10/2007 | Reisenauer |
| 2007/0253201 A1 | 11/2007 | Blincoe |
| 2007/0253202 A1 | 11/2007 | Wu |
| 2007/0253209 A1 | 11/2007 | Loh et al. |
| 2007/0268698 A1 | 11/2007 | Chen et al. |
| 2007/0269915 A1 | 11/2007 | Leong et al. |
| 2007/0275576 A1 | 11/2007 | Yang |
| 2007/0285028 A1 | 12/2007 | Tsinker et al. |
| 2007/0295969 A1 | 12/2007 | Chew et al. |
| 2007/0297177 A1 | 12/2007 | Wang |
| 2008/0012036 A1 | 1/2008 | Loh et al. |
| 2008/0013316 A1 | 1/2008 | Chiang |
| 2008/0043470 A1 | 2/2008 | Wimberly |
| 2008/0076272 A1* | 3/2008 | Hsu ............ H05K 7/1061 439/55 |
| 2008/0080190 A1 | 4/2008 | Walczak |
| 2008/0084700 A1 | 4/2008 | Van De Ven |
| 2008/0106907 A1 | 5/2008 | Trott |
| 2008/0112121 A1* | 5/2008 | Cheng ............ G06F 1/26 361/601 |
| 2008/0117500 A1 | 5/2008 | Narendran et al. |
| 2008/0121921 A1 | 5/2008 | Loh et al. |
| 2008/0130275 A1 | 6/2008 | Higley |
| 2008/0142194 A1 | 6/2008 | Zhou |
| 2008/0157112 A1* | 7/2008 | He ............ F21V 31/005 257/98 |
| 2008/0158881 A1 | 7/2008 | Liu |
| 2008/0158887 A1 | 7/2008 | Zhu |
| 2008/0165530 A1 | 7/2008 | Hendrikus |
| 2008/0173884 A1 | 7/2008 | Chitnis et al. |
| 2008/0179611 A1 | 7/2008 | Chitnis et al. |
| 2008/0192478 A1 | 8/2008 | Chen |
| 2008/0198112 A1 | 8/2008 | Roberts |
| 2008/0219002 A1 | 9/2008 | Sommers et al. |
| 2008/0219303 A1 | 9/2008 | Chen et al. |
| 2008/0224598 A1 | 9/2008 | Baretz |
| 2008/0224631 A1 | 9/2008 | Melanson |
| 2008/0274641 A1 | 11/2008 | Weber |
| 2008/0308825 A1 | 12/2008 | Chakraborty et al. |
| 2009/0021936 A1 | 1/2009 | Stimac et al. |
| 2009/0026913 A1 | 1/2009 | Mrakovich |
| 2009/0034283 A1 | 2/2009 | Albright |
| 2009/0046464 A1 | 2/2009 | Liu |
| 2009/0050907 A1 | 2/2009 | Yuan et al. |
| 2009/0050908 A1 | 2/2009 | Yuan et al. |
| 2009/0052158 A1 | 2/2009 | Bierhuizen |
| 2009/0080185 A1 | 3/2009 | McMillan |
| 2009/0086474 A1 | 4/2009 | Chou |
| 2009/0091935 A1 | 4/2009 | Tsai |
| 2009/0103299 A1 | 4/2009 | Boyer et al. |
| 2009/0129084 A1 | 5/2009 | Tsao |
| 2009/0141500 A1 | 6/2009 | Peng |
| 2009/0154166 A1 | 6/2009 | Zhang |
| 2009/0167203 A1 | 7/2009 | Dahlman et al. |
| 2009/0180276 A1 | 7/2009 | Benitez |
| 2009/0184616 A1 | 7/2009 | Van De Ven et al. |
| 2009/0195168 A1 | 8/2009 | Greenfeld |
| 2009/0225551 A1 | 9/2009 | Chang et al. |
| 2009/0236997 A1 | 9/2009 | Liu |
| 2009/0294114 A1 | 12/2009 | Yang |
| 2009/0296388 A1 | 12/2009 | Wu et al. |
| 2009/0310354 A1 | 12/2009 | Zampini, II et al. |
| 2009/0317988 A1* | 12/2009 | Lin ............ G01R 1/0466 439/68 |
| 2010/0015821 A1* | 1/2010 | Hsu ............ H01L 23/4093 439/66 |
| 2010/0019697 A1 | 1/2010 | Korsunsky |
| 2010/0026158 A1 | 2/2010 | Wu |
| 2010/0027258 A1 | 2/2010 | Maxik |
| 2010/0060202 A1 | 3/2010 | Melanson et al. |
| 2010/0072505 A1* | 3/2010 | Gingrich, III ............ F21K 9/00 257/99 |
| 2010/0073783 A1 | 3/2010 | Sun |
| 2010/0073884 A1 | 3/2010 | Peloza |
| 2010/0091487 A1 | 4/2010 | Shin |
| 2010/0091497 A1 | 4/2010 | Chen |
| 2010/0102696 A1 | 4/2010 | Sun |
| 2010/0110684 A1 | 5/2010 | Abdelsamed et al. |
| 2010/0110728 A1 | 5/2010 | Dubrow et al. |
| 2010/0128484 A1 | 5/2010 | Peng |
| 2010/0132918 A1 | 6/2010 | Lin |
| 2010/0141173 A1 | 6/2010 | Negrete |
| 2010/0142189 A1 | 6/2010 | Hong |
| 2010/0149818 A1 | 6/2010 | Ruffin |
| 2010/0157605 A1 | 6/2010 | Chang |
| 2010/0174345 A1 | 7/2010 | Ashdown |
| 2010/0195323 A1 | 8/2010 | Schaefer et al. |
| 2010/0230709 A1* | 9/2010 | Kanno ............ H01R 13/20 257/99 |
| 2010/0238630 A1 | 9/2010 | Xu |
| 2010/0243219 A1 | 9/2010 | Yang |
| 2010/0246179 A1 | 9/2010 | Long |
| 2010/0260945 A1 | 10/2010 | Kites |
| 2010/0284181 A1 | 11/2010 | O'Brien et al. |
| 2010/0296289 A1 | 11/2010 | Villard et al. |
| 2010/0301360 A1 | 12/2010 | Van De Ven |
| 2010/0301774 A1 | 12/2010 | Chemel et al. |
| 2010/0308742 A1 | 12/2010 | Melanson |
| 2010/0319953 A1 | 12/2010 | Yochum et al. |
| 2011/0013397 A1 | 1/2011 | Catone et al. |
| 2011/0043129 A1 | 2/2011 | Koolen |
| 2011/0044046 A1 | 2/2011 | Abu-Ageel |
| 2011/0049749 A1 | 3/2011 | Bailey |
| 2011/0050100 A1 | 3/2011 | Bailey |
| 2011/0050101 A1 | 3/2011 | Bailey |
| 2011/0050124 A1 | 3/2011 | Bailey |
| 2011/0051407 A1 | 3/2011 | St. Ives et al. |
| 2011/0051414 A1 | 3/2011 | Bailey |
| 2011/0090684 A1 | 4/2011 | Logan et al. |
| 2011/0097921 A1* | 4/2011 | Hsu ............ H05K 7/10 439/331 |
| 2011/0103070 A1 | 5/2011 | Zhang et al. |
| 2011/0115381 A1 | 5/2011 | Carlin |
| 2011/0122643 A1 | 5/2011 | Spork |
| 2011/0134634 A1 | 6/2011 | Gingrich, III |
| 2011/0136374 A1 | 6/2011 | Mostoller |
| 2011/0140620 A1 | 6/2011 | Lin et al. |
| 2011/0180841 A1* | 7/2011 | Chang ............ F21K 9/00 257/99 |
| 2011/0193490 A1 | 8/2011 | Kumar |
| 2011/0210360 A1 | 9/2011 | Negley |
| 2011/0222270 A1 | 9/2011 | Porciatti |
| 2011/0222277 A1 | 9/2011 | Negley |
| 2011/0253358 A1 | 10/2011 | Huang |
| 2011/0255287 A1 | 10/2011 | Li |
| 2011/0273079 A1 | 11/2011 | Pickard |
| 2011/0279015 A1 | 11/2011 | Negley |
| 2011/0285308 A1 | 11/2011 | Crystal |
| 2011/0285314 A1 | 11/2011 | Carney et al. |
| 2011/0292483 A1 | 12/2011 | Pakhchyan et al. |
| 2011/0306219 A1* | 12/2011 | Swanger ............ H05K 3/325 439/55 |
| 2011/0309773 A1 | 12/2011 | Beers |
| 2011/0316441 A1 | 12/2011 | Huynh |
| 2011/0316446 A1 | 12/2011 | Kang et al. |
| 2012/0002417 A1 | 1/2012 | Li |
| 2012/0014115 A1 | 1/2012 | Park et al. |
| 2012/0018754 A1* | 1/2012 | Lowes ............ F21K 9/135 257/98 |
| 2012/0019127 A1 | 1/2012 | Hirosaki |

(56) References Cited

U.S. PATENT DOCUMENTS

| | | | |
|---|---|---|---|
| 2012/0021623 A1* | 1/2012 | Gorman | H01R 4/44 439/76.1 |
| 2012/0025729 A1 | 2/2012 | Melanson | |
| 2012/0038280 A1 | 2/2012 | Zoorob et al. | |
| 2012/0038291 A1 | 2/2012 | Hasnain | |
| 2012/0051048 A1 | 3/2012 | Smit | |
| 2012/0051056 A1 | 3/2012 | Derks | |
| 2012/0051068 A1 | 3/2012 | Pelton | |
| 2012/0092860 A1 | 4/2012 | Blackstone | |
| 2012/0106152 A1 | 5/2012 | Zheng | |
| 2012/0112661 A1 | 5/2012 | Van De Ven | |
| 2012/0119658 A1 | 5/2012 | McDaniel | |
| 2012/0140468 A1 | 6/2012 | Chang | |
| 2012/0140474 A1 | 6/2012 | Jurik | |
| 2012/0146519 A1 | 6/2012 | Briggs | |
| 2012/0169242 A1 | 7/2012 | Olson | |
| 2012/0175653 A1* | 7/2012 | Weber | F21V 15/01 257/98 |
| 2012/0187830 A1* | 7/2012 | Shum | H05K 1/021 315/32 |
| 2012/0223657 A1 | 9/2012 | Van De Ven | |
| 2012/0224177 A1 | 9/2012 | Harbers et al. | |
| 2012/0236553 A1 | 9/2012 | Cash | |
| 2012/0250309 A1 | 10/2012 | Handsaker | |
| 2012/0268894 A1 | 10/2012 | Alexander | |
| 2012/0286304 A1 | 11/2012 | Letoquin | |
| 2012/0286319 A1* | 11/2012 | Lee | H01L 33/642 257/99 |
| 2012/0287642 A1 | 11/2012 | Zeng | |
| 2012/0292660 A1* | 11/2012 | Kanno | H01L 33/647 257/99 |
| 2012/0307487 A1 | 12/2012 | Eckel | |
| 2012/0307494 A1 | 12/2012 | Zlotnikov et al. | |
| 2012/0313124 A1 | 12/2012 | Clatterbuck | |
| 2013/0002167 A1 | 1/2013 | Van De Ven | |
| 2013/0003370 A1 | 1/2013 | Watanabe | |
| 2013/0003388 A1 | 1/2013 | Jensen | |
| 2013/0026942 A1 | 1/2013 | Ryan | |
| 2013/0042510 A1 | 2/2013 | Nall et al. | |
| 2013/0049602 A1 | 2/2013 | Raj | |
| 2013/0049603 A1 | 2/2013 | Bradford | |
| 2013/0049627 A1 | 2/2013 | Roberts et al. | |
| 2013/0069561 A1 | 3/2013 | Melanson et al. | |
| 2013/0070441 A1 | 3/2013 | Moon | |
| 2013/0070442 A1 | 3/2013 | Negley | |
| 2013/0082612 A1 | 4/2013 | Kim | |
| 2013/0083510 A1 | 4/2013 | Park | |
| 2013/0094225 A1 | 4/2013 | Leichner | |
| 2013/0095673 A1* | 4/2013 | Brandon | H01R 12/58 439/55 |
| 2013/0140490 A1 | 6/2013 | Fujinaga | |
| 2013/0162140 A1 | 6/2013 | Shamoto et al. | |
| 2013/0170220 A1 | 7/2013 | Bueeler | |
| 2013/0170221 A1 | 7/2013 | Isogai et al. | |
| 2013/0176728 A1 | 7/2013 | Bizzotto et al. | |
| 2013/0193869 A1 | 8/2013 | Hong et al. | |
| 2013/0221489 A1 | 8/2013 | Cao et al. | |
| 2013/0229114 A1 | 9/2013 | Eisele et al. | |
| 2013/0229804 A1 | 9/2013 | Holder et al. | |
| 2013/0235555 A1 | 9/2013 | Tanaka | |
| 2013/0235579 A1 | 9/2013 | Smith | |
| 2013/0235580 A1 | 9/2013 | Smith | |
| 2013/0241392 A1 | 9/2013 | Pickard et al. | |
| 2013/0241440 A1 | 9/2013 | Gaknoki et al. | |
| 2013/0249434 A1 | 9/2013 | Medendorp | |
| 2013/0250573 A1 | 9/2013 | Taskar et al. | |
| 2013/0250581 A1 | 9/2013 | Tang et al. | |
| 2013/0258636 A1 | 10/2013 | Rettke | |
| 2013/0265777 A1 | 10/2013 | Zollers et al. | |
| 2013/0300303 A1 | 11/2013 | Liu | |
| 2013/0301252 A1 | 11/2013 | Hussell et al. | |
| 2013/0322072 A1 | 12/2013 | Pu et al. | |
| 2014/0015419 A1 | 1/2014 | Shah et al. | |
| 2014/0016318 A1 | 1/2014 | Pokrajac | |
| 2014/0036510 A1 | 2/2014 | Preston et al. | |
| 2014/0043813 A1 | 2/2014 | Dubé et al. | |
| 2014/0048743 A1 | 2/2014 | Le-Mercier | |
| 2014/0049241 A1 | 2/2014 | Gaknoki et al. | |
| 2014/0049962 A1 | 2/2014 | Holder et al. | |
| 2014/0055038 A1 | 2/2014 | Cappitelli et al. | |
| 2014/0055054 A1 | 2/2014 | Borkar et al. | |
| 2014/0062330 A1 | 3/2014 | Neundorfer | |
| 2014/0063779 A1 | 3/2014 | Bradford | |
| 2014/0071685 A1 | 3/2014 | Black et al. | |
| 2014/0071696 A1 | 3/2014 | Park, II et al. | |
| 2014/0078715 A1 | 3/2014 | Pickard et al. | |
| 2014/0078722 A1 | 3/2014 | Caldwell et al. | |
| 2014/0078746 A1 | 3/2014 | Caldwell et al. | |
| 2014/0103796 A1 | 4/2014 | Jansen | |
| 2014/0126205 A1 | 5/2014 | Davis et al. | |
| 2014/0126224 A1 | 5/2014 | Brunt, Jr. et al. | |
| 2014/0134880 A1* | 5/2014 | Yeh | H05K 7/00 439/620.15 |
| 2014/0140052 A1 | 5/2014 | Villard | |
| 2014/0159077 A1* | 6/2014 | Kuenzler | H05K 1/0209 257/89 |
| 2014/0159600 A1 | 6/2014 | Sutardja | |
| 2014/0167601 A1 | 6/2014 | Harry | |
| 2014/0167646 A1 | 6/2014 | Zukauskas et al. | |
| 2014/0176016 A1 | 6/2014 | Li | |
| 2014/0198531 A1 | 7/2014 | Iwasaki | |
| 2014/0217433 A1 | 8/2014 | Tudorica | |
| 2014/0217907 A1 | 8/2014 | Harris | |
| 2014/0218909 A1 | 8/2014 | Tetsuo et al. | |
| 2014/0225511 A1 | 8/2014 | Pickard et al. | |
| 2014/0225532 A1 | 8/2014 | Groeneveld | |
| 2014/0268631 A1 | 9/2014 | Pickard | |
| 2014/0268724 A1 | 9/2014 | Yanping | |
| 2014/0268737 A1 | 9/2014 | Athalye et al. | |
| 2014/0286016 A1 | 9/2014 | Montagne | |
| 2014/0286018 A1 | 9/2014 | Zhang et al. | |
| 2014/0361701 A1 | 12/2014 | Siessegger et al. | |
| 2014/0367633 A1 | 12/2014 | Bibl | |
| 2015/0002034 A1 | 1/2015 | Van De Ven | |
| 2015/0029717 A1 | 1/2015 | Shen et al. | |
| 2015/0036339 A1 | 2/2015 | Ashdown et al. | |
| 2015/0043218 A1 | 2/2015 | Hu | |
| 2015/0060922 A1 | 3/2015 | Wilcox | |
| 2015/0236225 A1 | 8/2015 | David | |
| 2015/0295144 A1 | 10/2015 | Weiler | |
| 2016/0174319 A1 | 6/2016 | Li | |

FOREIGN PATENT DOCUMENTS

| | | |
|---|---|---|
| CN | 201739849 A | 2/2011 |
| CN | 202040752 A | 11/2011 |
| CN | 102269351 A | 12/2011 |
| GB | 2457016 A | 8/2009 |
| JP | 61-070306 U | 5/1986 |
| JP | 2003-092022 A | 3/2003 |
| JP | 2004-179048 A | 6/2004 |
| JP | 2004-265626 A | 9/2004 |
| JP | 2005-017554 A | 1/2005 |
| JP | 2005-071818 A | 3/2005 |
| JP | 2005-235778 A | 9/2005 |
| JP | 2005-267964 A | 9/2005 |
| JP | 2006-236796 A | 9/2006 |
| JP | 2006-253274 A | 9/2006 |
| JP | 2006-310138 A | 11/2006 |
| JP | D1307268 B | 8/2007 |
| JP | D1307434 B | 8/2007 |
| JP | 2007-273205 A | 10/2007 |
| JP | 2007-273209 A | 10/2007 |
| JP | 2011-508406 A | 3/2011 |
| JP | 2011-204495 A | 10/2011 |
| JP | 2011-204658 A | 10/2011 |
| KR | 1020070039683 A | 4/2007 |
| KR | 1020090013704 A | 2/2009 |
| KR | 100974942 B1 | 8/2010 |
| KR | 1020120050280 A | 5/2012 |
| TW | 2004-25542 A | 11/2004 |
| TW | 290967 M | 5/2006 |
| TW | 296481 M | 8/2006 |

(56) References Cited

FOREIGN PATENT DOCUMENTS

| TW | 1273858 B | 2/2007 |
|---|---|---|
| TW | 1318461 B | 12/2009 |
| WO | DM/057383 B | 9/2001 |
| WO | 02/12788 A1 | 2/2002 |
| WO | 02/15281 A2 | 2/2002 |
| WO | 2004/071143 A1 | 8/2004 |
| WO | 2005/093862 A2 | 10/2005 |
| WO | 2006/066531 A1 | 6/2006 |
| WO | 2006066531 A1 | 6/2006 |
| WO | 2007/128070 A1 | 11/2007 |
| WO | 2008/108832 A1 | 9/2008 |
| WO | 2009/044330 A1 | 4/2009 |
| WO | 2009108799 A1 | 9/2009 |
| WO | 2009/120555 A1 | 10/2009 |
| WO | 2010/016002 A1 | 2/2010 |
| WO | 2010059647 A1 | 5/2010 |
| WO | 2011019945 A1 | 2/2011 |
| WO | 2013059298 A1 | 4/2013 |
| WO | 2013192014 A2 | 12/2013 |
| WO | 2013192014 A3 | 12/2013 |
| WO | 2014099681 A2 | 6/2014 |
| WO | 2014099681 A3 | 12/2014 |

OTHER PUBLICATIONS

Acuity Brands Lighting Inc. Product Catalog, downloaded from www.acuitybrands.com, dated Apr. 2013, 90pp.
Acuity Brands, "A Guided Tour of Area Light Sources—Past, Present and Future," downloaded from www.acuitybrands.com, version dated Jun. 20, 2013, 72pp.
Alanod GmbH, "WhiteOptics," downloaded from www.alanod.com, dated Apr. 2014, 12pp.
Altman Lighting, "Spectra Cube," downloaded from http://altmanstagelighting.com/altman-led-green-lighting/led-spectra-cube/Altman-Spectra-Cube-Data-Sheet-v3.pdf on May 28, 2014, 1p.
Bega Lighting, "In-ground luminaire RGBW IP 67 Product data sheet," downloaded from http://www.bega.com/download/datenblaetter/en/7926.pdf on May 28, 2014, 1p.
CORM 2011 Conference, Gaithersburg, MD, "Calculation of CCT and Duv and Practical Conversion Formulae," dated May 3-5, 2011, National Institute of Standards and Technology, 28pp.
Lumitronix, "Carclo lens for side emitting 360 degrees," downloaded from http://www.leds.de/en/High-Power-LEDs/Lenses-and-optics/Carclo-lens-for-side-emitting-360.html on May 28, 2014, 2pp.
"Introduction to Catmull-Rom Splines," downloaded on Aug. 7, 2015 from www.mvps.org/directx/articles/catmull/, 2pp.
Wikipedia, "CIE 1931 color space," version dated Apr. 23, 2014, downloaded from www.wikipedia.org, 12pp.
Osram Sylvania, "ColorCalculator User Guide", downloaded on Jun. 3, 2014 from www.sylvania.com, 44pp.
Osram Sylvania, "ColorCalculator User Guide", downloaded on Oct. 19, 2015 from www.sylvania.com, 50pp.
Kenneth Kelly, "Color Designations for Lights," U.S. Department of Commerce, National Bureau of Standards, Research Paper RP1565, Journal of Research of the National Bureau of Standards, vol. 31, Nov. 1943, pp. 271-278.
Philips Color Kinetics, "LED Cove Lighting," downloaded on May 28, 2014 from http://www.colorkinetics.com/ls/guides-brochures/pck-led-cove-lighting.pdf 32pp.
Philips Color Kinetics, "IntelliWhite LED Lighting Systems," downloaded on May 28, 2014 from http://www.colorkinetics.com/ls/intelliwhite/, 2pp.
Philips Color Kinetics, "Color-Changing LED Lighting Systems," downloaded on May 27, 2014 from http://www.colorkinetics.com/ls/rgb/, 2pp.
Wikipedia, "Color temperature," version dated May 21, 2014, downloaded on Jun. 3, 2014 from www.wikipedia.org, 17pp.
Cree, "Led Color Mixing: Basics and Background," downloaded on Sep. 24, 2014 from www.cree.com, 24pp.
Cree, "Cree(r) LMH2 LED Modules," Product Family Data Sheet, downloaded on May 27, 2014 from http://www.cree.com/~/media/Files/Cree/LED%20Components%20and%20Modules/Modules/Data%20Sheets/LEDModules.LMH2.pdf, 18pp.
"Dialight ES Series RGB LED Luminaire," downloaded on May 28, 2014 from http://www.dialight.com/Assets/Brochures_And_Catalogs/Illumination/MDEXESTEMORGB_A.pdf 2pp.
Naomi Miller, "Color Spaces and Planckian Loci: Understanding all those Crazy Color Metrics," U.S Department of Energy, Pacific Northwest National Laboratory, Portland, Oregon, downloaded on May 30, 2014, 49pp.
Kahen, Keith, "High-Efficiency Colloidal Quantum Dot Phosphors," University at Buffalo, SUNY, DOE SSL R&D Workshop, Long Beach, California, Jan. 29-31, 2013, 12pp.
Bush, Steve, "Chip gives dim-to-warm LED lighting without MCU," dated Apr. 1, 2014, downloaded from http://www.electronicsweekly.com/news/components/led-lighting/chip-gives-dim-warm-led-lighting-without-mcu-2014-04/, 6pp.
"Ecosense to reveal new TROV LED Linear Platform at 2015 Lightfair International in New York City," May 4, 2015, blog downloaded from www.ecosense.com, 3pp.
"Ecosense to reveal new TROV LED Linear Platform at 2015 Lightfair International in New York City," May 4, 2015, press release downloaded from www.ecosense.com, 2pp.
Freyssinier, Jean P. et al., "Class A Color Designation for Light Sources Used in General Illumination," J. Light & Vis. Env., vol. 37, Nos. 2-3, Nov. 7, 2013, pp. 10-14.
Freyssinier, Jean P. et al., "White Lighting: A Provisional Model for Predicting Perceived Tint in 'White' Illumination," Color Res. & App'n, vol. 39, No. 5, Oct. 2014, pp. 466-479.
Freyssinier, Jean P. et al., "The Class A Color Designation for Light Sources," Rensselaer Polytechnic Institute, 2013 DOE Solid-State Lighting R&D Workshop, Hilton Long Beach, California, Jan. 29-31, 2013, 26pp.
Freyssinier, Jean P. et al., "Class A Lighting," Rensselaer Polytechnic Institute, Strategies in Light 2012, 27 pp.
Freyssinier, Jean P. et al., "White Lighting," Color Res. & App'n, (vol. unknown), Sep. 3, 2011, downloaded from http://www.lrc.rpi.edu/programs/solidstate/assist/pdf/SIL-2012_FreyssinierRea_WhiteLighting.pdf, 12pp.
Rea et al., "White lighting for residential applications," Lighting Res. Technol., Mar. 27, 2012, downloaded from www.sagepublications.com at http://lrt.sagepub.com/content/early/2012/03/27/1477153512442936, 15pp.
Oh, Jeong et al., "Full down-conversion of amber-emitting phosphor-converted light-emitting diodes with powder phosphors and a long-wave pass filter," Optics Express, vol. 18, No. 11, May 24, 2010, pp. 11063-11072.
"Microcellular Reflective Sheet MCPET," downloaded on Feb. 3, 2015 from www.furukawa.co.jp/foam/, 6pp.
"Aculux—Black Body Dimming and Tunable White Responsive Technologies," downloaded on May 28, 2014 from http://www.junolightinggroup.com/literature/LIT-AX-LED-BBD-TW.pdf, 28pp.
"Khatod—Symmetric & Asymmetric STRIP LENS," downloaded on May 5, 2015 from www.khatod.com, 3pp.
"KKDC Catalog 2.0," downloaded on May 28, 2014 from http://www.kkdc.co.uk/media/kkdc-catalogue.pdf, 134pp.
"KKDC UK—Linear LED Lighting," downloaded from www.kkdc.co.uk/application/interior.php on Oct. 22, 2015, 5pp.
Overton, Gail, "LEDS: White LED comprises blue LED and inexpensive dye," LaserFocusWorld, Feb. 12, 2013, downloaded from http://www.laserfocusworld.com/articles/print/volume-49/issue-02/world-news/leds--white-led-comprises-blue-led-and-inexpensive-dye.html, 5pp.
"LEDIL TIR Lens Guide," downloaded from www.ledil.com on Jan. 22, 2015, 8pp.
"LED Linear—linear lighting solutions, product overview," downloaded on May 28, 2014 from http://www.led-linear.com/en/product-overview/system-catalogue/, 3pp.

(56) References Cited

OTHER PUBLICATIONS

"LEDnovation—BR30 Warm Dimming," downloaded on May 28, 2014 from www.lednovation.com/products/BR30_LED.asp, 2pp.
Wikipedia, "Lenticular lens," downloaded on Feb. 18, 2015 from www.wikipedia.org, 5pp.
"Lenticular Sheets," downloaded on Feb. 24, 2015 from www.lenticular-sheets.lpceurope.eu/, 2pp.
Unzner, Norbert, "Light Analysis in lighting technology," B&S Electronische Geralte GmbH, 2001, 14pp.
"Lightolier—Solid-State Lighting," downloaded on May 28, 2014 from http://www.lightolier.com/prospots/leds_solidstate.jsp, 1p.
Wikipedia, "Line of purples," downloaded on Oct. 20, 2015 from www.wikipedia.org, 2pp.
"Lumenbeam Catalog," downloaded on May 27, 2014 from 11_160_en_lumenpulse_lumenbeam_rgb_lbl_rgb_brochure.zip, 63pp.
"Lumenetix—Araya Technology," downloaded on May 28, 2014 from www.lumenetix.com/araya-technology, 3pp.
"Lumenpulse—Lumenbeam Large Color Changing,", downloaded on May 27, 2014 from www.lumenpulse.com/en/product/11/lumenbeam-large-color-changing, 4pp.
"Lumenpulse—Lumencove Family," downloaded on May 28, 2014 from http://www.lumenpulse.com/en/products#!3/0/0/0/0/0, 2pp.
Knight, Colette, "XICATO—Investigations on the use of LED modules for optimized color appearance in retail applications," downloaded on May 28, 2014 from http://www.xicato.com/sites/default/files/documents/Summary_investigations_on_the_use_of_LED_modules_for_optimized_color_appearance_in_retail_applications.pdf, 5pp.
"Zumtobel—IYON Tunable White,", downloaded on Oct. 19, 2015 from http://www.zumtobel.com/tunablewhite/en/index.html#topic_04, 1p.
"ZUMTOBEL—IYON LED Spotlight Catalog," downloaded on Oct. 19, 2015 from http://www.zumtobel.com/PDB/Ressource/teaser/en/com/Iyon.pdf, 40pp.
"Lumenpulse—Lumenbeam Large Pendant Dynamic White," downloaded on May 28, 2014 from http://www.lumenpulse.com/en/product/72/lumenbeam-large-pendant-dynamic-white, 1p.
"Lumileds Application Brief AB08—Optical Testing for SuperFlux, SnapLED and Luxeon Emitters," downloaded on Sep. 24, 2014 from www.lumileds.com, 15pp.
"CandlePowerForums—SOLD: Luxeon III side-emitter white LED," downloaded on May 28, 2014 from http://www.candlepowerforums.com/vb/showthread.php?140276-SOLD-Luxeon-III-side-emitter-white-LED, 4pp.
"Lumileds LUXEON Z,", downloaded on May 2, 2015 from www.lumileds.com, 2pp.
"Alanod MIRO Catalog," downloaded on Jan. 30, 2015 from www.alanod.com, 8pp.
"Nanoco Group—Cadmium Free Quantum Dots," downloaded on May 30, 2014 from www.nanocotechnologies.com/what-we-do/products/cadmium-free-quantum-dots, 3pp.
"Nanosys—Quantum Dots," downloaded on May 30, 2014 from www.nanosysinc.com/what-we-do/quantum-dots/, 3pp.
"Ocean NanoTech—Products," downloaded on May 30, 2014 from www.oceannanotech.com/Products.php, 1p.
"NNCrystal—blog post—May 17, 2010," downloaded from http://led-lights-led.blogspot.com/2010/05/nncrystal-us-corporation-to-supply.html, 4pp.
"A Warmer, Cozier White Light: NXP Transforms LED Color Quality," dated Jan. 9, 2013, downloaded from http://www.nxp.com/news/press-releases/2013/01/a-warmer-cozier-white-light-nxp-transforms-led-color-quality.html, 2pp.
"Lighting Global Technical Notes, Optical Control Techniques for Off-grid Lighting Products," Jul. 2011 and May 2012, 6pp.
"Pacific Light Technologies—Quantum Dots in Solid State Lighting," downloaded on Oct. 23, 2015 from www.pacificlighttech.com/quantum-dots-in-ssl/, 2pp.
"Philips Lighting—Dim Tone,", downloaded on May 27, 2014 from www.usa.lighting.philips.com/lightcommunity/trends/led/dimtone/, 1p.
"Philips—Dimmable to warm light for the perfect ambience," downloaded on May 27, 2014 from www.usa.lighting.philips.com, 2pp.
"Philips—Turn up Ambience and Tone Down Energy Use with Philips BR30 DimTone," downloaded on May 27, 2014 from www.usa.lighting.philips.com, 11pp.
Wikipedia, "Planckian locus," downloaded on May 30, 2014 from www.wikipedia.org, 5pp.
Wikipedia, "Quantum dot,", downloaded on May 30, 2014 from http://en.wikipedia.org/wiki/Quantum_dot, 15pp.
"Phosphortech—Flexible Phosphor Sheet—RadiantFlex Datasheet," Aug. 2014, downloaded from www.phosphortech.com, 10pp.
Wikipedia, "Reflectivity,", downloaded on Jan. 22, 2015 from www.wikipedia.org, 3pp.
"Refraction by lenses," downloaded on Feb. 17, 2015 from www.physicsclassroom.com, 5pp.
"RTLED—White Paper: Binning and LED," downloaded on Oct. 13, 2014 from www.rtled.com, 3pp.
Near, Al, "Seeing Beyond CRI," LED Testing & Application, Nov. 2011, downloaded from www.ies.org/lda/hottopics/led/4.pdf, 2pp.
"Selux—Olivio luminaire," press release dated Mar. 26, 2014, downloaded from http://www.selux.com/be/en/news/press/press-detail/article/evolutionary-progress-the-olivio-family-of-system-luminaires-now-with-premium-quality-white-and.html, 3pp.
"LEDIL—Strada-F Series," downloaded on May 5, 2015 from www.ledil.com, 7pp.
"Sylvania—ULTRA SE(tm) LED Lamp Family," downloaded on May 27, 2014 from www. sylvania.com, 3pp.
"Sylvania ULTRA SE(tm) LED Light Bulbs with Color Dimming Sunset Effects," downloaded on May 27, 2014 from https://www.youtube.com/watch?v=oZEc-VfJ8EU, 2pp.
Wikipedia, "Transmittance," downloaded on Jan. 22, 2015 from www.wikipedia.org, 4pp.
"United Lumen—A Volumetric Displaced Phosphor Light Engine which elegantly and efficiently distributes light in a pattern similar to an incandescent bulb," downloaded on Jul. 9, 2014 from www.unitedlumen.com, 1p.
"United Lumen—Solid State Volumetric Technology," downloaded on Jul. 9, 2014 from www.unitedlumen.com, 1p.
"United Lumen—High Brightness V-LED Technology," downloaded on May 15, 2014 from www.unitedlumen.com, 1p.
"USAI Lighting Catalog," downloaded on May 27, 2014 from http://www.usaillumination.com/pdf/Warm_Glow_Dimming.pdf, 50pp.
"Winona—Parata 700 Series Cove," downloaded on May 28, 2014 from www.acuitybrands.com, 2pp.
"Winona Parata Catalog," downloaded on May 28, 2014 from www.acuitybrands.com, 24pp.
Petluri et al., U.S. Appl. No. 14/526,504, filed Oct. 28, 2014, entitled "Lighting Systems Having Multiple Light Sources," 92pp.
Petluri et al., U.S. Appl. No. 14/636,204, filed Mar. 3, 2015, entitled "Lighting Systems Including Lens Modules for Selectable Light Distribution," 119pp.
Pickard et al., U.S. Appl. No. 14/617,849, filed Feb. 9, 2015, entitled "Lighting Systems Generating Controlled and Wavelength-Converted Light Emissions," 83pp.
Rodgers et al., U.S. Appl. No. 14/702,800, filed May 4, 2015, entitled "Lighting Systems Including Asymmetric Lens Modules for Selectable Light Distribution," 116pp.
Pickard et al., U.S. Appl. No. 14/636,205, filed Mar. 3, 2015, entitled "Low-Profile Lighting System Having Pivotable Lighting Enclosure," 56pp.
Fletcher et al., U.S. Appl. No. 14/702,765, filed May 4, 2015, entitled "Lighting System Having a Sealing System," 92pp.
Fletcher et al., U.S. Appl. No. 29/519,149, filed Mar. 3, 2015, entitled "LED Luminaire," 8pp.
Fletcher et al., U.S. Appl. No. 29/519,153, filed Mar. 03, 2015, entitled "LED Luminaire," 8pp.

(56) References Cited

OTHER PUBLICATIONS

Fletcher et al., U.S. Appl. No. 14/816,827, filed Aug. 3, 2015, entitled "Lighting System Having a Mounting Device," 126pp.
Rodgers et al., U.S. Appl. No. 62/202,936, filed Aug. 10, 2015, entitled "Optical Devices and Systems Having a Converging Lens With Grooves," 133pp.
Fletcher et al., U.S. Appl. No. 29/532,383, filed Jul. 6, 2015, entitled "LED Luminaire Having a Mounting System," 10pp.
Fletcher et al., U.S. Appl. No. 29/533,635, filed Jul. 20, 2015, entitled "LED Luminaire Having a Mounting System," 10pp.
Fletcher et al., U.S. Appl. No. 29/533,666, filed Jul. 20, 2015, entitled "LED Luminaire Having a Mounting System," 10pp.
Fletcher et al., U.S. Appl. No. 29/533,667, filed Jul. 20, 2015, entitled "LED Luminaire Having a Mounting System," 10pp.
PCT/US2007/023110, Journee Lighting Inc., International Preliminary Report on Patentability Dated Sep. 8, 2009.
PCT/US2009/035321, Journee Lighting Inc., International Preliminary Report on Patentability Dated Aug. 31, 2010.
PCT/US2009/064858, Journee Lighting Inc., International Preliminary Report on Patentability Dated May 24, 2011.
PCT/US2010/045361, Journee Lighting Inc., International Preliminary Report on Patentability Dated Feb. 14, 2012.
PCT/US2012/060588, Ecosense Lighting Inc., Filed on Oct. 17, 2012.
PCT/US2012/060588, Ecosense Lighting Inc., International Search Report and Opinion Dated Mar. 29, 2013.
PCT/US2012/060588, Ecosense Lighting Inc., International Preliminary Report on Patentability Dated Apr. 22, 2014.
PCT/US2013/045708, Journee Lighting Inc., International Search Report and Opinion Dated Nov. 27, 2013.
PCT/US2013/045708, Dated Journee Lighting Inc., International Preliminary Report on Patentability Dated May 12, 2015.
PCT/US2013/075172, Ecosense Lighting Inc., Filed on Dec. 13, 2013.
PCT/US2013/075172, Ecosense Lighting Inc., International Search Report and Opinion Dated Sep. 26, 2014.
PCT/US2013/075172, Ecosense Lighting Inc., International Preliminary Report on Patentability Dated Jun. 23, 2015.
PCT/US2016/020521, Ecosense Lighting Inc., Filed on Mar. 2, 2016.
PCT/US2016/020521, Ecosense Lighting Inc., International Search Report and Opinion Dated May 3, 2016.
PCT/US2016/016972, Ecosense Lighting Inc., Filed on Feb. 8, 2016.
PCT/US2016/016972, Ecosense Lighting Inc., International Search Report and Opinion Dated Apr. 11, 2016.
PCT/US2016/030613, Ecosense Lighting Inc., Filed on May 3, 2016.
PCT/US2016/020523, Ecosense Lighting Inc., Filed on Mar. 2, 2016.
PCT/US2016/020523, Ecosense Lighting Inc., International Search Report and Opinion Dated May 6, 2016.
PCT/US2016/015470, Ecosense Lighting Inc., Filed on Jan. 28, 2016, Entitled "Zoned Optical Cup."
Petluri et al., U.S. Appl. No. 62/288,368, filed Jan. 28, 2016, entitled "Multizone Mixing Cup".
PCT/US2016/015473, Ecosense Lighting Inc., Filed on Jan. 28, 2016, Entitled "Illuminating With a Multizone Mixing Cup."

PCT/US2016/015473, Ecosense Lighting Inc., International Search Report and Opinion Mailed on Apr. 22, 2016.
Petluri et al., U.S. Appl. No. 15/170,806, filed Jun. 1, 2016, entitled "Illuminating With a Multizone Mixing Cup."
PCT/US2016/015318, Ecosense Lighting Inc., Filed on Jan. 28, 2016, Entitled "Compositions for LED Light Conversions."
PCT/US2016/015318, Ecosense Lighting Inc., International Search Report and Opinion, Mailed on Apr. 11, 2016.
PCT/US2016/015348, Ecosense Lighting Inc., Filed on Jan. 28, 2016, Entitled "Systems for Providing Tunable White Light With High Color Rendering."
PCT/US2016/015348, Ecosense Lighting Inc., International Search Report and Opinion Mailed on Apr. 11, 2016.
PCT/US2016/015368, Ecosense Lighting Inc., Filed on Jan. 28, 2016, Entitled "Systems for Providing Tunable White Light With High Color Rendering."
PCT/US2016/015368, Ecosense Lighting Inc., International Search Report and Opinion Mailed on Apr. 19, 2016.
Petluri et al., U.S. Appl. No. 15/173,538, filed Jun. 3, 2016, entitled "System for Providing Tunable White Light With High Color Rendering."
Petluri et al., U.S. Appl. No. 15/173,554, filed Jun. 3, 2016, entitled "System for Providing Tunable White Light With High Color Rendering."
PCT/US2016/015385, Ecosense Lighting Inc., Filed on Jan. 28, 2016, Entitled "Methods for Generating Tunable White Light With High Color Rendering."
PCT/US2016/015402, Ecosense Lighting Inc., Filed on Jan. 28, 2016, Entitled "Methods for Generating Tunable White Light With High Color Rendering."
PCT/US2016/015435, Ecosense Lighting Inc., Filed on Jan. 28, 2016, Entitled "Methods for Generating Melatonin-Response-Tuned White Light With Light Color Rendering."
PCT/US2016/015437, Ecosense Lighting Inc., Filed on Jan. 28, 2016, Entitled "Methods for Generating Melatonin-Response-Tuned White Light With Light Color Rendering."
PCT/US2016/015441, Ecosense Lighting Inc., Filed on Jan. 28, 2016, Entitled "Methods for Generating Melatonin-Response-Tuned White Light With Light Color Rendering."
Petluri et al., U.S. Appl. No. 15/176,083, filed Jun. 7, 2016, entitled "Compositions for LED Light Conversions."
PCT/US2016/030613, Ecosense Lighting Inc., International Search Report and Opinion Dated Aug. 5, 2016.
PCT/US2016/046245, Ecosense Lighting Inc., Filed on Aug. 10, 2016.
PCT/US2016/015470, Ecosense Lighting Inc., International Search Report and Opinion Dated Jul. 8, 2016.
PCT/US2016/015385, Ecosense Lighting Inc., International Search Report and Opinion Dated Apr. 8, 2016.
PCT/US2016/015402, Ecosense Lighting Inc., International Search Report and Opinion Dated Apr. 22, 2016.
PCT/US2016/015435, Ecosense Lighting Inc., International Search Report and Opinion Dated Mar. 31, 2016.
PCT/US2016/015437, Ecosense Lighting Inc., International Search Report and Opinion Dated Mar. 31, 2016.
PCT/US2016/015441, Ecosense Lighting Inc., International Search Report and Opinion Dated Mar. 31, 2016.

* cited by examiner

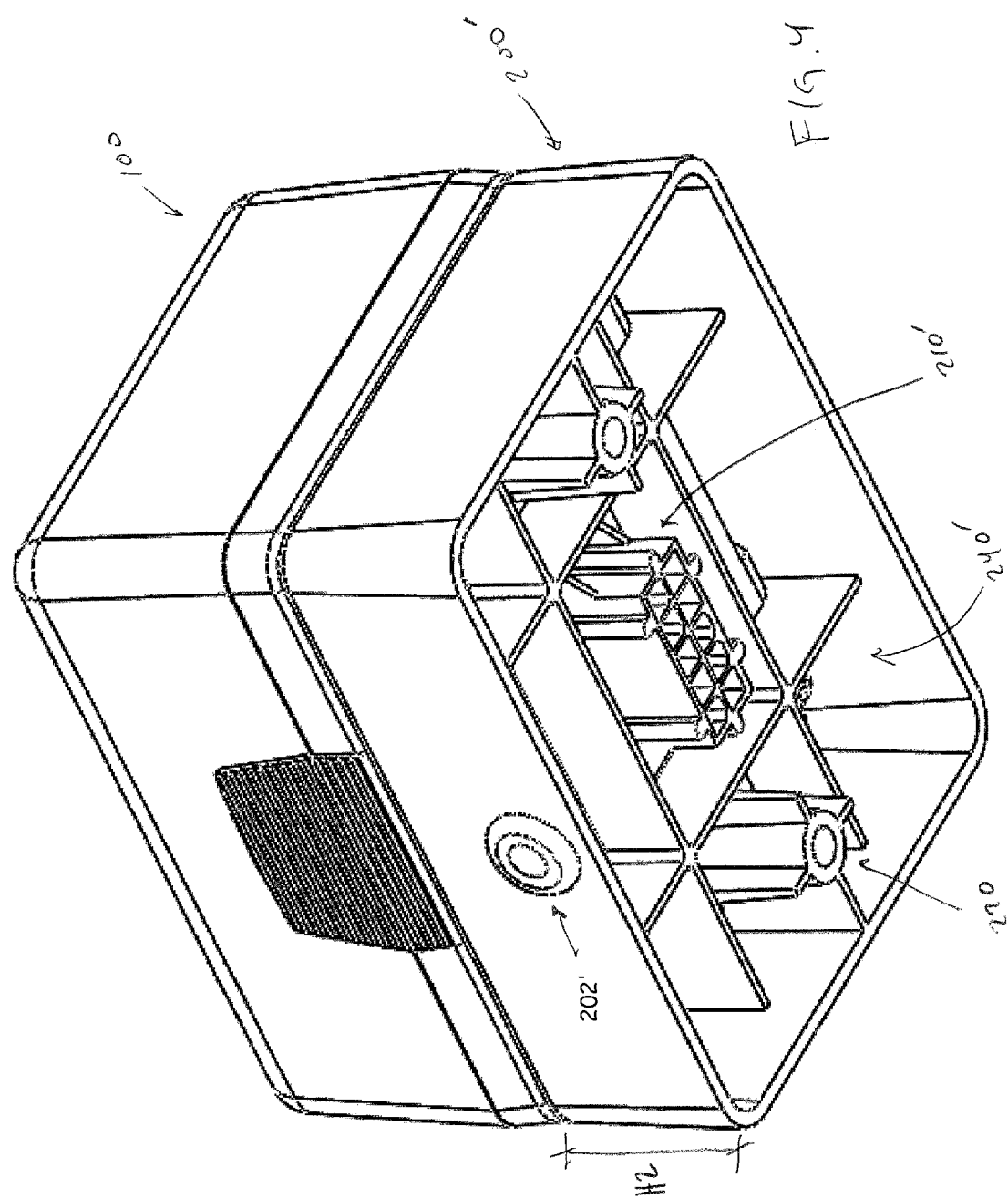

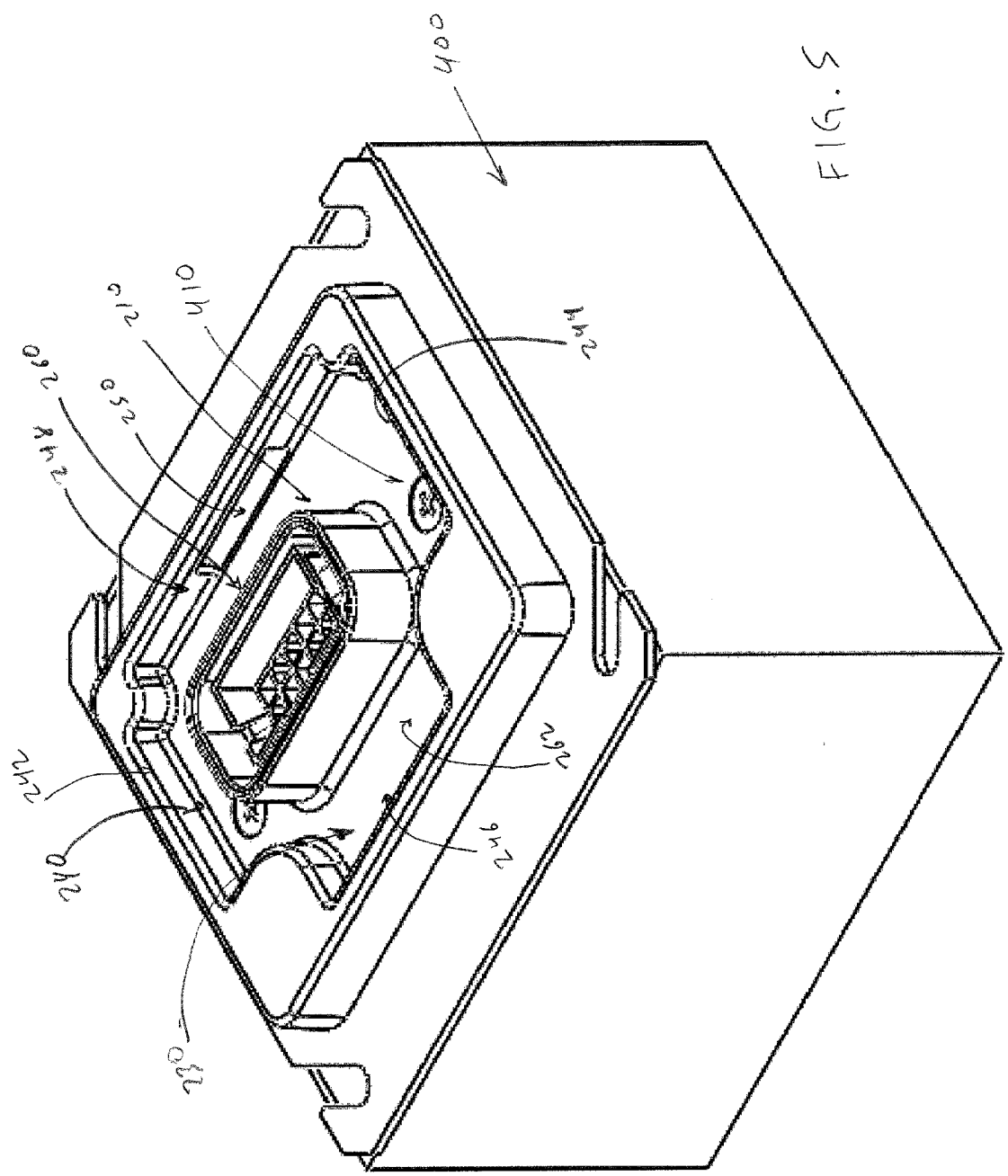

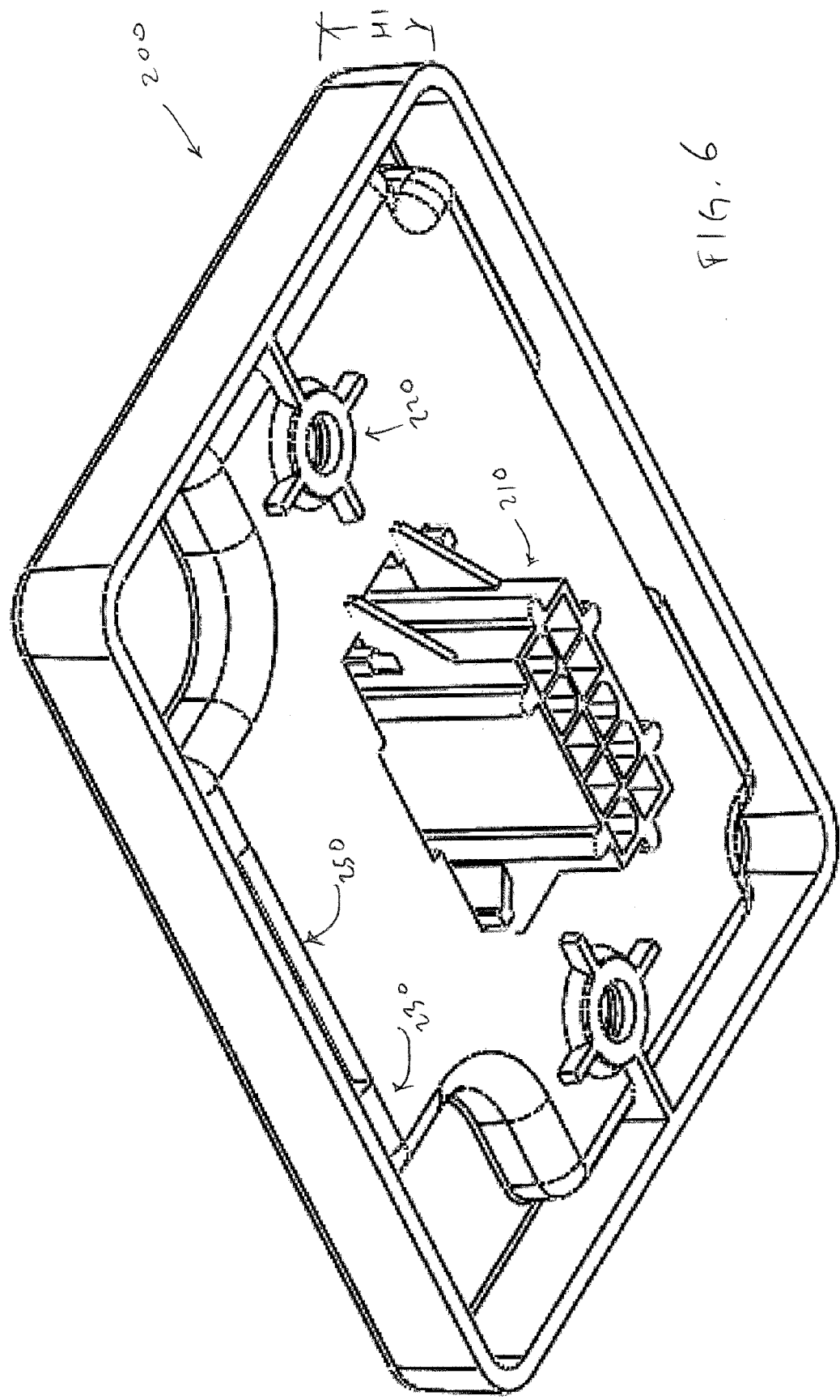

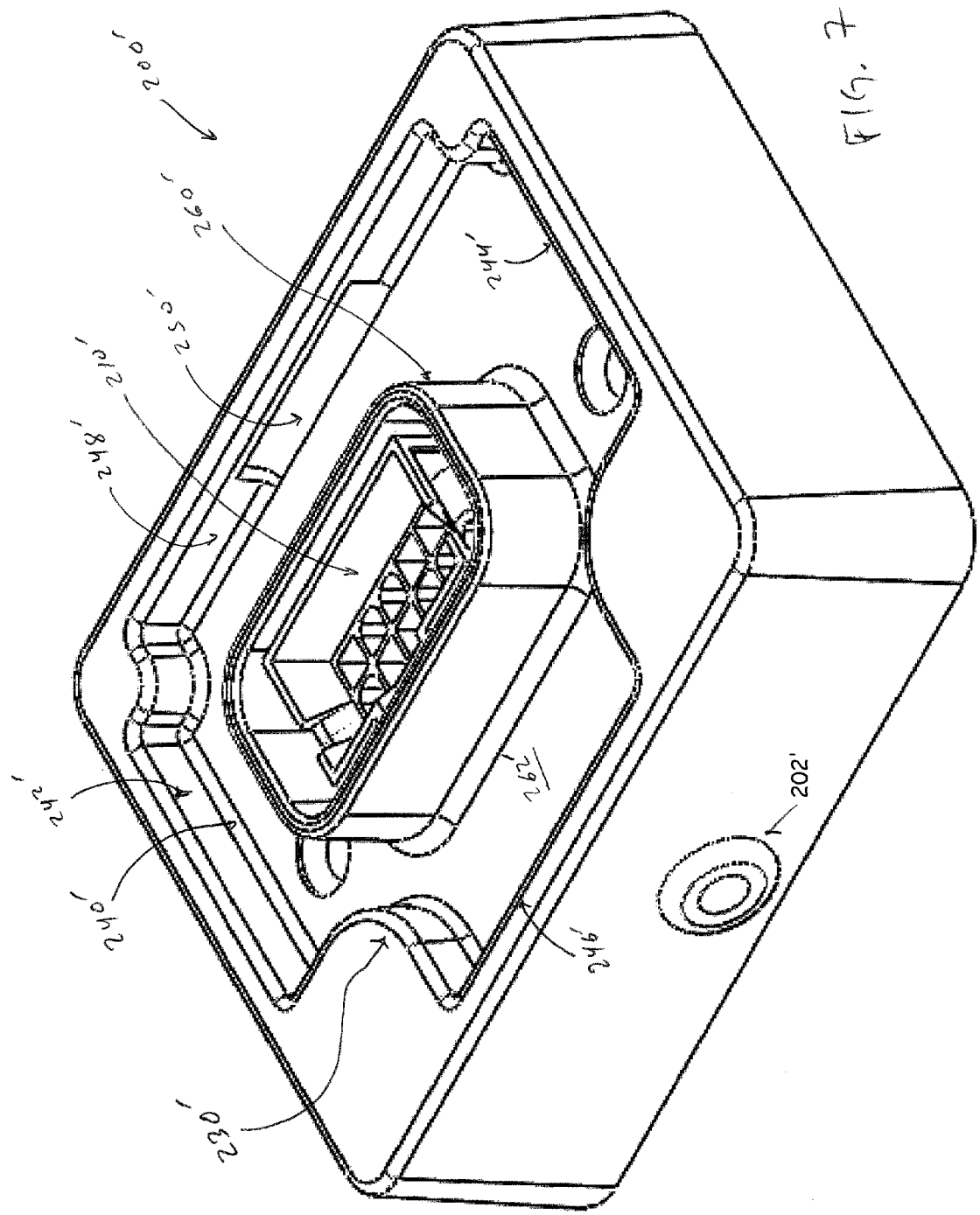

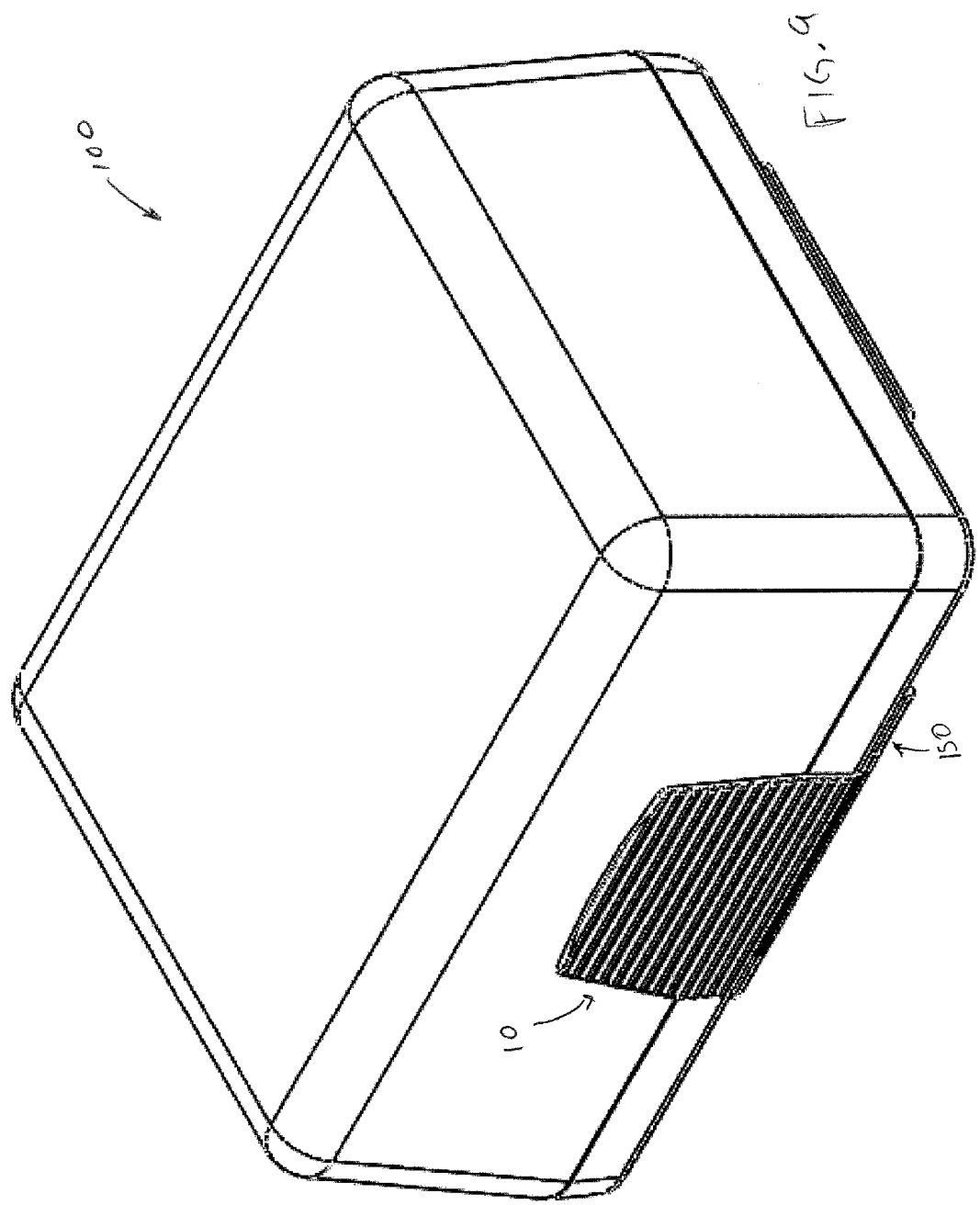

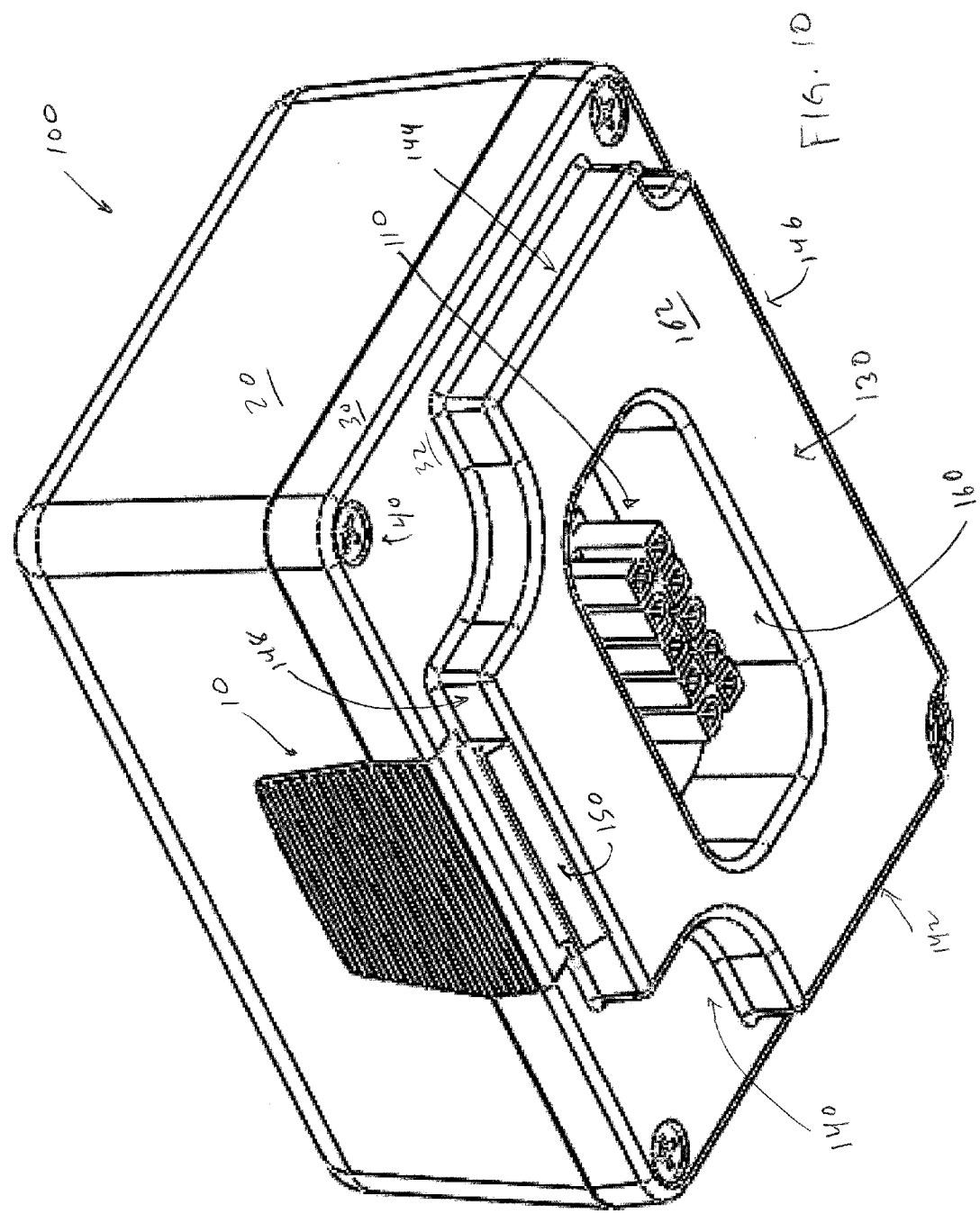

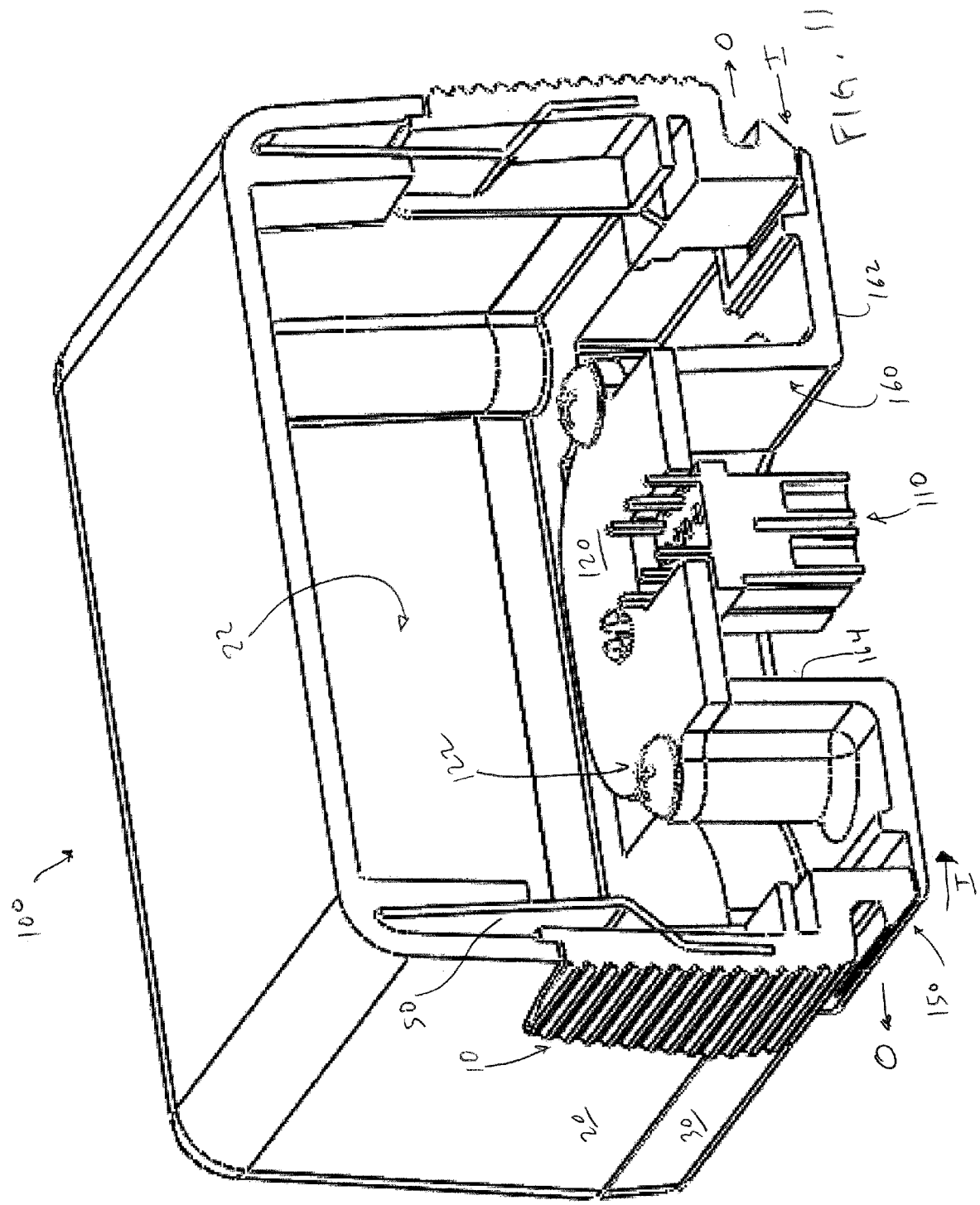

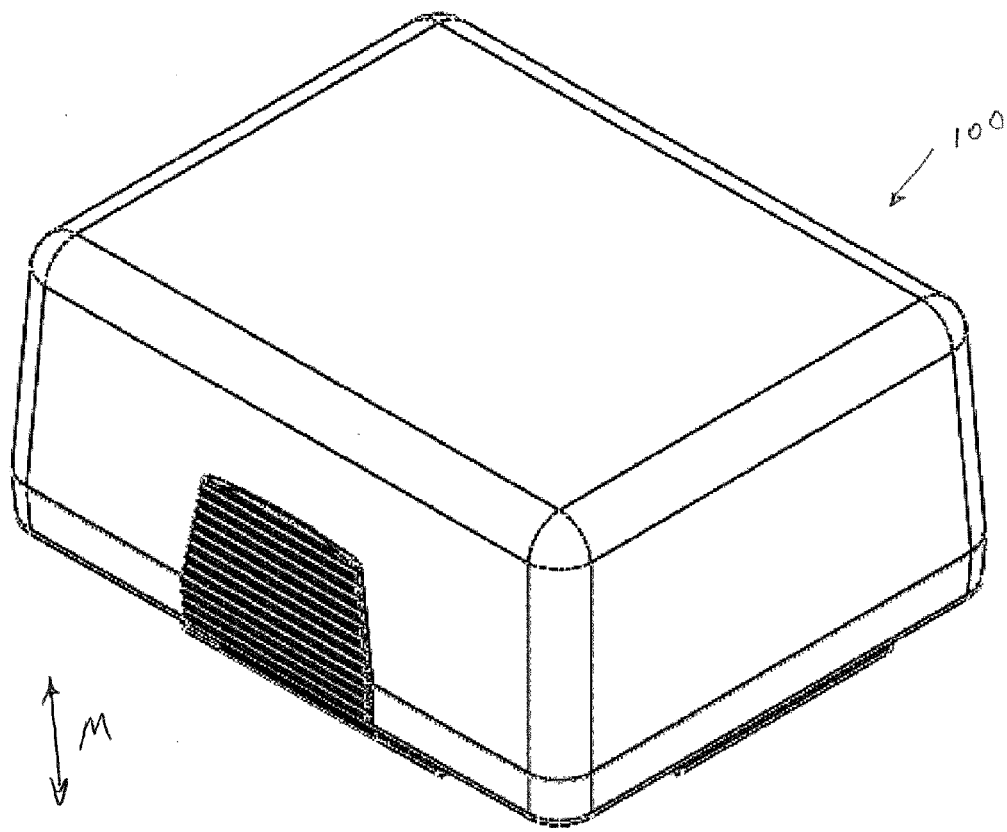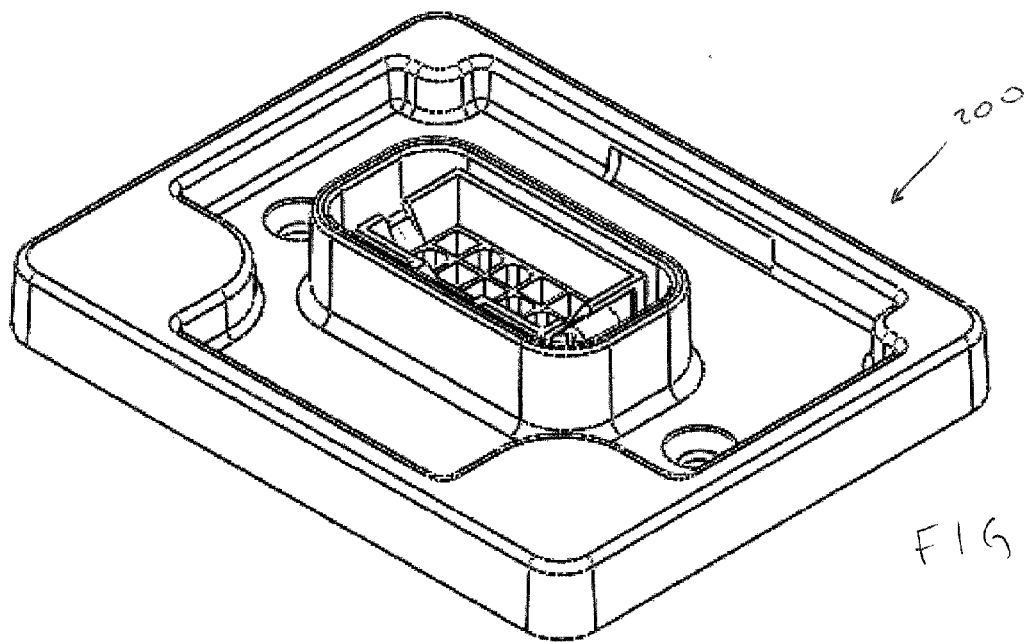
FIG 12

FIELD REPLACEABLE POWER SUPPLY CARTRIDGE

INCORPORATION BY REFERENCE TO ANY PRIORITY APPLICATIONS

Any and all applications for which a foreign or domestic priority claim is identified in the application Data Sheet as filed with the present application are hereby incorporated by reference under 37 CFR 1.57. This application claims the benefit of U.S. Provisional Application No. 61/765,257, filed Feb. 15, 2013 and titled FIELD REPLACEABLE POWER SUPPLY CARTRIDGE, the entirety of which is incorporated by reference and should be considered a part of this specification.

BACKGROUND

Field

The invention is directed to a field replaceable power supply cartridge and more particularly to a field replaceable power supply cartridge for use within lighting fixture assemblies.

Description of the Related Art

There are many different electric lighting technologies, which all require a power supply, a transformer or a ballast (e.g., LED, HID, Compact Fluorescent, linear fluorescent, low-voltage halogen, etc.). All of the above mentioned lighting technologies can be used in many different form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc. One of the most common types of light fixtures which use an integrated power supply is recessed down lights.

Recessed down lights are a popular and elegant way to provide lighting to a space, with the recessed down lights mounted in a ceiling so that only a trim ring and the light bulb is open to view, while the rest of the components, including the power supply (e.g. LED driver, fluorescent ballast, HID ballast or step down transformer), are disposed on the other side of the ceiling and hidden from view. The power supply is typically housed in a sheet metal or plastic box. Power supplies fail over time, for example, due to the exposure of the electronics to heat generated by the lighting system.

One drawback with conventional power supplies is that they can be difficult and time consuming to replace because of the limited access space through the ceiling opening where the recessed down light is mounted. In a typical recessed down light, replacing the power supply includes reaching through the aperture in the ceiling and around the lighting assembly, removing wing nuts or thumb nuts (or other types of threaded fasteners) that attach the power supply to the lighting assembly, removing the power supply through the ceiling aperture along with the lead wires that wire the power supply to the lighting assembly, cutting and stripping the wires and attaching them to the new power supply, inserting the new power supply through the ceiling aperture, and coupling the new power supply to the lighting assembly with the thumb screws or thumb nuts. Because all of this is done through the limited space provided by the ceiling aperture for the recessed down light, a user has to perform all of these steps with a single hand, which makes the process take longer, particularly because of all the different parts and steps that are involved in replacing the power supply. And in most cases the user cannot see the power supply within the recessed down light, and therefore has to remove and replace the fasteners without a line of sight to the power supply assembly while performing these steps.

Accordingly, there is a need for an improved and simpler system and method for replacing a power supply within a light fixture assembly.

SUMMARY

In one embodiment, a field replaceable power supply cartridge is provided for coupling with a socket. The cartridge can have a latch mechanism that can be actuated by the user to couple the cartridge to the socket, such that the one or more latches of the cartridge releasably engage one or more recessed portions in the socket. The cartridge can have a key feature that corresponds to a key feature on the socket, allowing the cartridge to be coupled to the socket in only one orientation, thereby preventing the incorrect electrical connection between the cartridge and the socket. The cartridge can have a multi-pin electrical connector for coupling to a corresponding connector on the socket. The socket can be a relatively short socket, where the electrical wires are bottom fed (e.g., from an electrical box), or can be a relatively tall socket, where the electrical wires are side fed via one or more openings in the body of the socket. The socket can be made of a thermally conductive material (e.g., aluminum) for transferring heat from the cartridge to the socket when the two are coupled to each other, such that the socket can provide for a thermal connection as well as an electrical connection between the cartridge and the socket.

In one embodiment, the field replaceable power supply cartridge can be an LED driver, such as a replaceable LED driver cartridge for use with down lighting (e.g., recessed lighting) systems. In another embodiment, the field replaceable power supply cartridge can be a ballast, such as a ballast for a fluorescent lighting system, a ballast for a compact fluorescent lighting system, a ballast for an HID (high intensity discharge) lighting system, or used in connection with any other light source or lighting system that uses a power supply or ballast. In another embodiment, the field replaceable power supply cartridge can be an LED driver cartridge for use within an LED light fixture assembly. In still another embodiment, the field replaceable power supply cartridge can be a transformer.

In accordance with one aspect of the present invention, a field replaceable LED driver system is provided. The system comprises an LED driver cartridge having a cartridge body, the cartridge body having a key feature defined on a bottom side of the cartridge body. The system also comprises one or more gripping members spring loaded relative to a portion of the cartridge body, the one or more gripping members configured to actuate one or more latches and configured to be pushed by a user to move the one or more latches inward relative to the cartridge body. The system also comprises a printed circuit board coupled to the cartridge body and an electrical connector on the bottom side of the cartridge body electrically connected to the printed circuit board. The key feature facilitates installment of the LED driver in a single predetermined orientation.

In accordance with another aspect of the present invention, a field replaceable LED driver system is provided. The system comprises an LED driver cartridge body, the cartridge body having a key feature defined on a bottom side of the cartridge body. The system also comprises one or more gripping members spring loaded relative to a portion of the cartridge body, the one or more gripping members configured to actuate one or more latches and configured to be pushed by a user to move the one or more latches inward relative to the cartridge body. The system also comprises an electrical connector on the bottom side of the cartridge body. The system also comprises a socket having a socket body coupleable to an electrical box and configured to releasably couple to the cartridge body, the socket body comprising one or more recess portions configured to releasably engage the one or more latches, the socket body having a key portion defined on a top side thereof, the key portion having a shape corresponding to a shape of the key feature such that the LED driver cartridge body couples to the socket in the single predetermined orientation. The key feature of the cartridge body and the key portion of the socket facilitate coupling of the LED driver cartridge body to the socket body in a single predetermined orientation.

BRIEF DESCRIPTION OF THE DRAWINGS

FIG. 4 is a bottom perspective view of the field replaceable power supply cartridge and socket of FIG. 3.

FIG. 5 is a top perspective view of one embodiment of a socket installed on an electrical box.

FIG. 6 is a bottom perspective view of the socket of FIG. 5.

FIG. 7 is a top perspective view of another embodiment of a socket.

FIG. 8 is a bottom perspective view of the socket of FIG. 7.

FIG. 10 is a bottom perspective view of the field replaceable power supply cartridge of FIG. 9.

FIG. 11 is a cross-sectional side view of the field replaceable power supply cartridge of FIG. 9.

FIG. 12 is a perspective exploded top view of the field replaceable power supply cartridge of FIG. 9 and socket of FIGS. 5-6.

DETAILED DESCRIPTION

The embodiments disclosed below describe an improved system and method for a field replaceable power supply cartridge. In one embodiment, the field replaceable power supply cartridge can be an LED driver cartridge, such as a replaceable LED driver cartridge for use with down lighting (e.g., recessed lighting) systems. In another embodiment, the field replaceable power supply cartridge can be a ballast, such as a ballast for a fluorescent lighting system, a ballast for a compact fluorescent lighting system, a ballast for an HID (high intensity discharge) lighting system, or used in connection with any other light source or lighting system that uses a power supply or ballast. In another embodiment, the field replaceable power supply cartridge can be an LED driver cartridge for use within an LED light fixture assembly. In still another embodiment, the field replaceable power supply cartridge can be a transformer (e.g., step down transformer).

One of skill in the art will recognize that the embodiments disclosed herein for a field replaceable power supply cartridge can be used as part of many lighting technologies, such as those discussed above. Additionally, the field replaceable power supply cartridge can be used in many different form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc.

Figure 1:
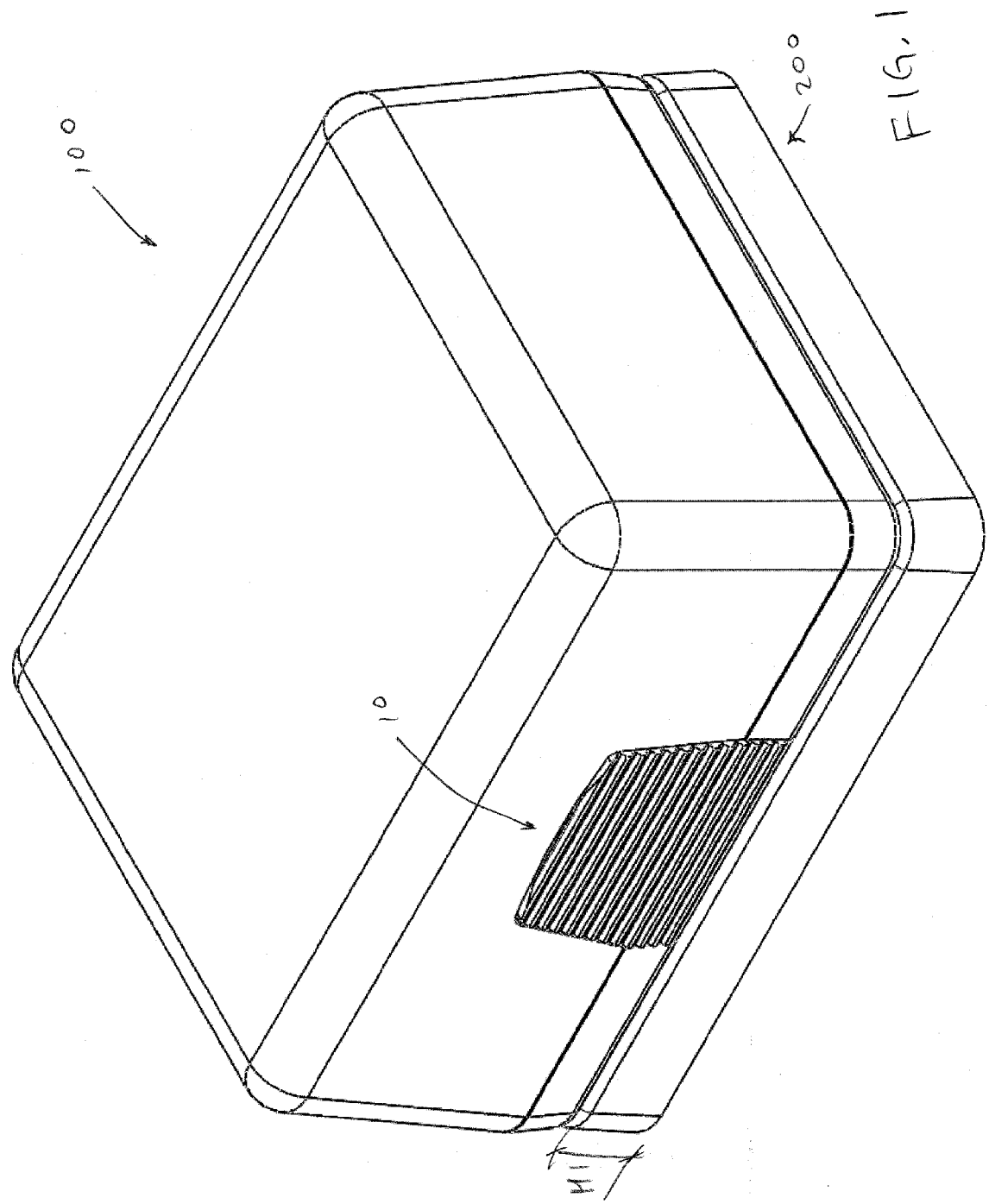
FIG. 1 is a top perspective view of one embodiment of a field replaceable power supply cartridge attached to one embodiment of a socket.
Figure 2:
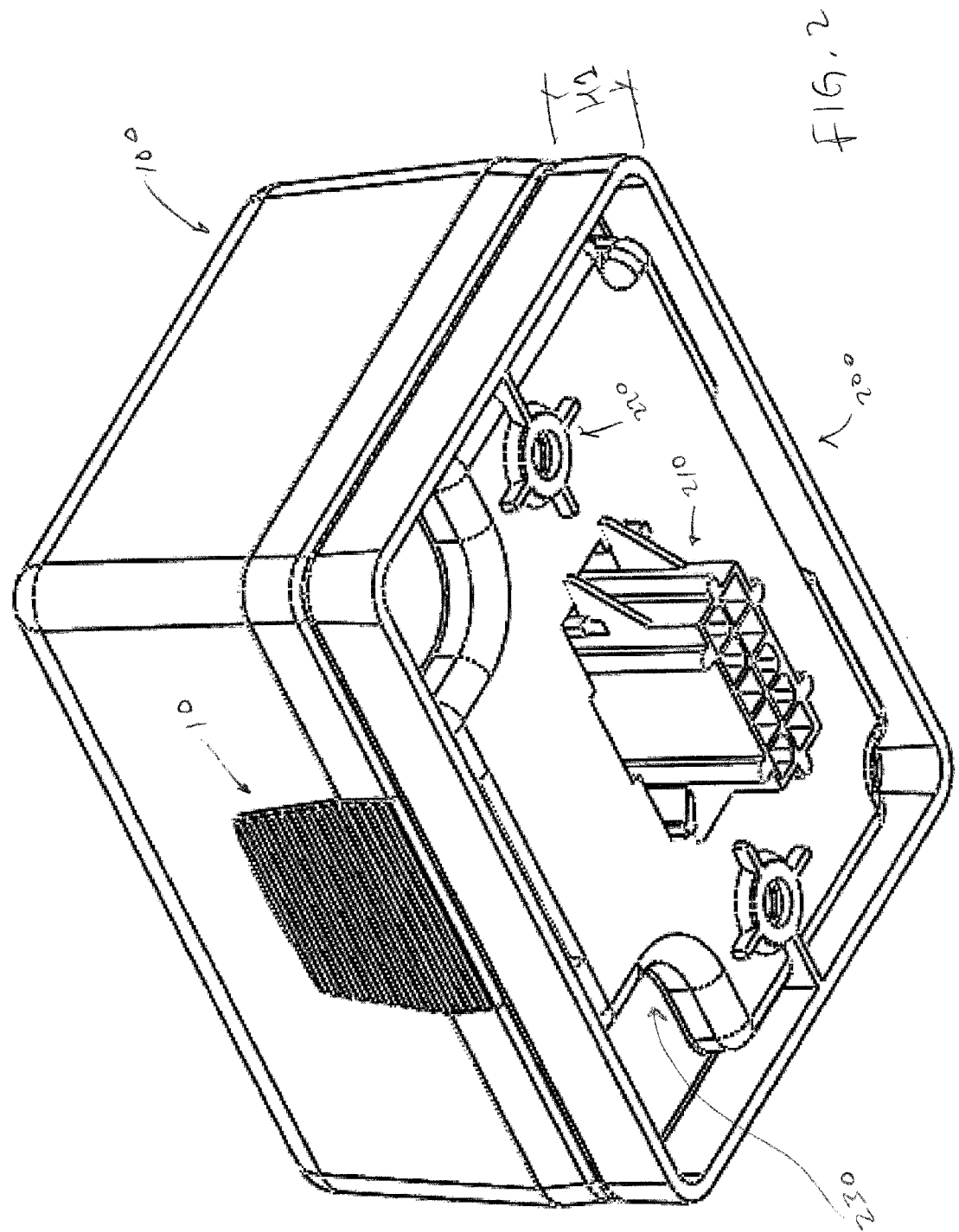
FIG. 2 is a bottom perspective view of the field replaceable power supply cartridge and socket of FIG. 1.

FIGS. 1-2 show one embodiment of a field replaceable power supply cartridge 100 (hereinafter "cartridge") coupled to one embodiment of a socket 200. In the illustrated embodiment, the cartridge 100 can be generally rectangular in shape. However, in other embodiments, the cartridge 100 can have other suitable shapes, such as square, round, etc. The cartridge 100 can have one or more gripping members 10 allowing a user to grip the cartridge 100 (e.g., grip with the user's fingers). In the illustrated embodiment, the cartridge 100 has two gripping members 10 on opposite sides of the cartridge 100. However, in other embodiments, the cartridge 100 can have more or fewer gripping members 10.

As shown in FIGS. 1-2, the socket 200 can have generally the same shaped perimeter as the cartridge 100. In another embodiment, the socket 200 can have a larger or smaller perimeter than the cartridge 100. In the illustrated embodiment, the socket 200 is a relatively short socket with a height H1. The socket 200 can be attached to an electrical box 400, as shown in FIG. 5, which can house one or more wires that couple to a multi-pin connector 210 of the socket 200 for coupling with a multi-pin connector 110 of the cartridge 100. The multi-pin connectors 110, 210 allow the cartridge 100 to provide multiple functions to the lighting system. For example, some of the pins of the connectors 110, 210 can take in house power, some of the pins of the connectors 110, 210 can provide driving control for the lighting system, some of the pins of the connectors 110, 210 could be used for dimming of the lighting system, some of the pins can be used to supply power and control to an active cooling system (e.g., fan) to cool the driver 100, and some of the pins of the connectors 110, 210 can communicate control signals to and from the driver 100.

In one embodiment, the socket 200 can be made of a thermally conductive material, such as Aluminum. However, the socket 200 can be made of other suitable materials (e.g., other metals or plastics). Additionally, in some embodiments, a thermal interface member (e.g., thermal pad) can be disposed between the cartridge 100 and the socket 200 to facilitate heat transfer between the cartridge 100 and the socket 200. That is, in some embodiments, the connection between the cartridge 100 and the socket 200 can be a thermal connection as well as an electrical connection.

With continued references to FIG. 2, the socket 200 can have one or more apertures 220 that can receive a fastener (e.g., screw) 410 therethrough to couple the socket 200 to, for example, the electrical box 400 (see FIG. 5). Additionally, the socket 200 can have a key feature 230, further described below, that allows the cartridge 100 to couple to the socket 200 in only one orientation, thereby preventing the erroneous coupling of the cartridge 100 to the socket 200, which may result in an incorrect alignment between the male and female multi-pin connectors and improper electrical connection between the cartridge 100 and the socket 200.

With continued reference to FIGS. 2 and 5, the short socket 200 can be coupled to the electrical box 400, and the electrical wires housed in the electrical box 400. The wires can be bottom fed to the connector 210 of the socket 200 from the electrical box 400. The electrical box 400 can be made of metal. In an embodiment where the cartridge 100 is a power supply cartridge (e.g., LED driver cartridge for a down lighting system), the electrical box 400 can be mounted above the ceiling and out of view to the user. In another embodiment, the electrical box may take the form of a cavity created within the light fixture housing (e.g. an internal wall of the light fixture that the socket can be mounted to, with a hollow cavity behind the wall). In yet another embodiment, the socket can be mounted to a wall of the light fixture housing or any surface of the light fixture housing.

Figure 3:
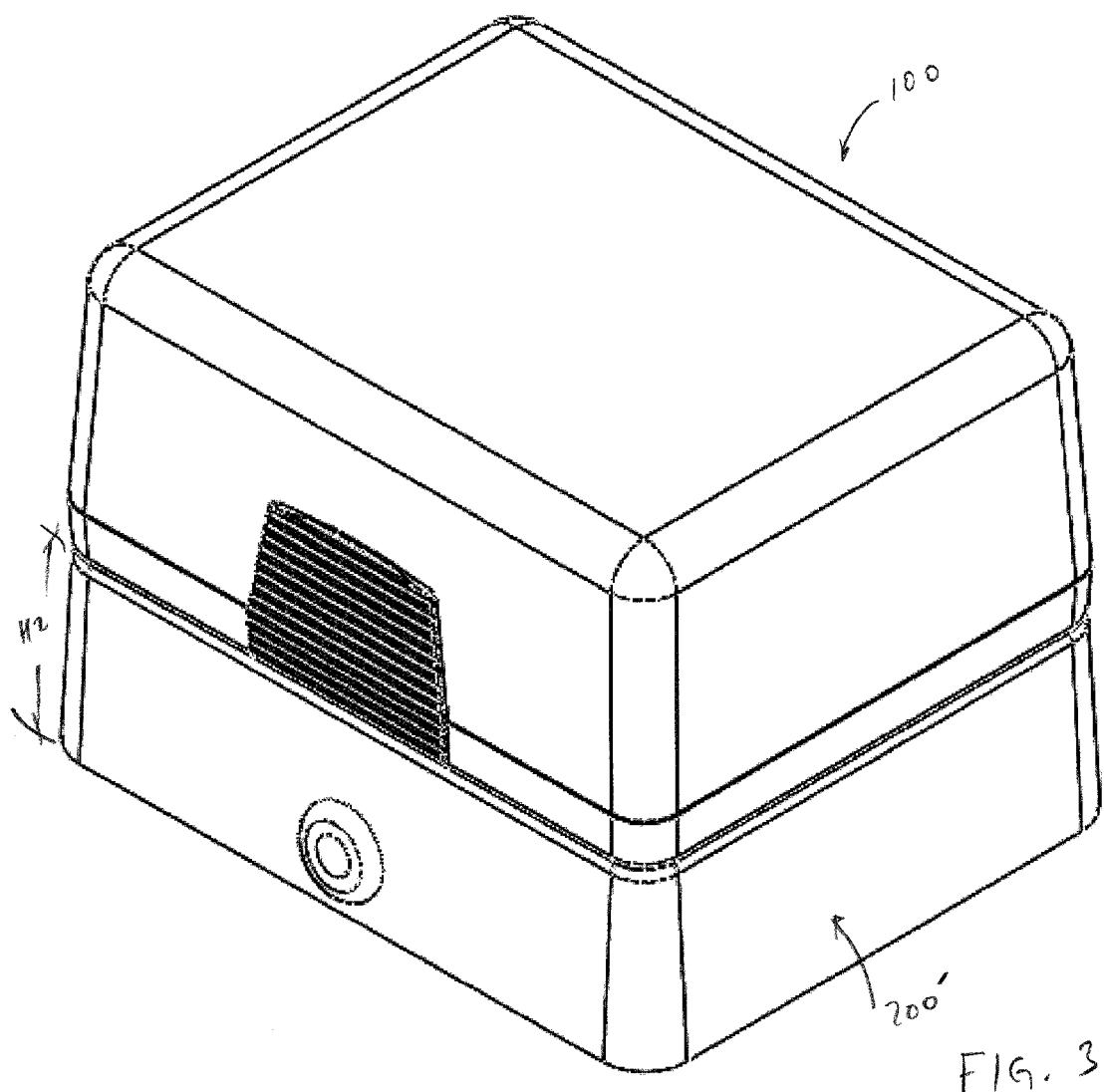
FIG. 3 is a top perspective view of another embodiment of a field replaceable power supply cartridge coupled to another embodiment of a socket.

FIGS. 3-4 show the cartridge 100 coupled to another embodiment of a socket 200'. The socket 200' has a height H2 that is greater than the height H1 of the socket 200, so that the socket 200' is a relatively tall socket. Like the socket 200, the socket 200' can include a multi-pin connector 210' and one or more apertures 220' that can receive a fastener (e.g., screw) therethrough to couple the socket 200' to another component (e.g., to mount the socket 200' to a structural beam above the ceiling). The socket 200' can also include one or more openings 202' sized to receive one or more wires therethrough and into an inner space 240' of the socket 200' so the wires can be connected to the connector 210'. Unlike the socket 200, the one or more openings 202' allow side feeding of the wires into the socket 200'. The socket 200' can be made of a thermally conductive material, such as Aluminum. However, other suitable materials can be used (e.g., other metals, other thermally conductive plastic materials or other types of plastics).

FIG. 5 shows the key feature 230 of the socket 200. The socket 200 can have a recessed portion 240 defined at least in part by a first side wall 242, a second side wall 244, a third side wall 246 and a fourth side wall 248. In the illustrated embodiment, the first and second side walls 242, 244 can have the same length, but the third and fourth sidewalls 246, 248 can have different lengths, so that a corresponding key feature 130 (described further below in with respect to FIG. 10) of the cartridge 100 can only be coupled to the key feature 230 of the socket 200 in one orientation, such that the multi-pin electrical connector 210 of the socket 200 can only couple to the multi-pin electrical connector 110 of the cartridge 100 in one orientation, thereby preventing an incorrect electrical connection between the cartridge 100 and socket 200. However, the key feature 230 can have other suitable configurations and still result in allowing the cartridge 100 to couple to the socket 200 in only one orientation. For example, in one embodiment, three of the four side surfaces of the recessed portion 240 can have the same length and the fourth side surface can have a different length. Advantageously, the key feature 230 allows a user to easily determine whether the cartridge 100 is in the correct orientation relative to the socket 200, and to position the cartridge 100 in the correct orientation relative to the socket 200 during the installation process.

The socket 200 also has one or more recesses 250 in one or more of the walls 242, 244, 246, 248, the one or more recesses 250 sized to releasably receive a corresponding latch 150 (see FIG. 10) of the cartridge 100. In the illustrated embodiment, the socket 200 can have two recesses 250 on the third and fourth sidewalls 246, 248 for releasably receiving corresponding latches 150 of the cartridge 100. However, in other embodiments, the socket 200 can have more or fewer recesses 250. Additionally, the recessed portion 240 of the socket 200 can define a protruding portion 260 of the electrical connector 210, which extends from a bottom surface 262 of the recessed portion 240. In one embodiment, a thermal interface member (e.g., thermal pad) can be inserted into the recessed portion 240 so that is contacts the bottom surface 262, such that the thermal interface member is disposed between the bottom surface 262 of the socket 200 and a base surface 162 of the cartridge 100 (see FIG. 10) when the cartridge 100 is coupled to the socket 200, to thereby facilitate heat transfer between the cartridge 100 and the socket 200. In another embodiment, the thermal interface member can be excluded and the base surface 162 of the cartridge 100 can contact the bottom surface 262 of the recessed portion 240 directly to transfer heat from the cartridge 100 to the socket 200. Heat transfer between the cartridge 100 and the socket 200 is not a necessary function of the invention. It can be used to help keep the power supply cool, or in other embodiments the cartridge and the socket can be made of plastic and there would be no thermal connection between the cartridge 100 and the socket 200.

FIG. 7 shows the key feature 230' of the socket 200' (the tall socket). The socket 200' can have a recessed portion 240' defined at least in part by a first side wall 242', a second side wall 244', a third side wall 246' and a fourth side wall 248'. In the illustrated embodiment, the first and second side walls 242', 244' can have the same length, but the third and fourth sidewalls 246', 248' can have different lengths, so that a corresponding key feature 130 (described further below in with respect to FIG. 10) of the cartridge 100 can only be coupled to the key feature 230' of the socket 200' in one orientation, such that the multi-pin electrical connector 210' of the socket 200' can only couple to the multi-pin electrical connector 110 of the cartridge 100 in one orientation, thereby preventing an incorrect electrical connection between the cartridge 100 and socket 200'. However, the key feature 230' can have other suitable configurations and still result in allowing the cartridge 100 to couple to the socket 200' in only one orientation. For example, in one embodiment, three of the four side surfaces of the recessed portion 240' can have the same length and the fourth side surface can have a different length. Advantageously, the key feature 230' allows a user to easily determine whether the cartridge 100 is in the correct orientation relative to the socket 200', and to position the cartridge 100 in the correct orientation relative to the socket 200' during the installation process.

The socket 200' also has one or more recesses 250' in one or more of the walls 242', 244', 246', 248', the one or more recesses 250' sized to releasably receive the corresponding latch 150 (see FIG. 10) of the cartridge 100. In the illustrated embodiment, the socket 200' can have two recesses 250' on the third and fourth sidewalls 246', 248' for releasably receiving corresponding latches 150 of the cartridge 100. However, in other embodiments, the socket 200' can have more or fewer recesses 250' defined on one or more side surfaces of the recessed portion 240'. Additionally, the recessed portion 240' of the socket 200' can define a protruding portion 260' of the electrical connector 210', which extends from a bottom surface 262' of the recessed portion 240'. In one embodiment, a thermal interface member (e.g., thermal pad) can be disposed in the recessed portion 240' in contact with the bottom surface 262', such that the thermal interface member is disposed between the bottom surface 262' of the socket 200' and the base surface 162 of the cartridge 100 (see FIG. 10) when the cartridge 100 is coupled to the socket 200', to thereby facilitate heat transfer between the cartridge 100 and the socket 200'. In another embodiment, the thermal interface member can be excluded and the base surface 162 of the cartridge 100 can contact the bottom surface 262' of the recessed portion directly to transfer heat from the cartridge 100 to the socket 200'. Heat transfer between the cartridge 100 and the socket 200' is not a necessary function of the invention. It can be used to help keep the power supply cool, or in other embodiments the cartridge and the socket can be made of plastic and there would be no thermal connection between the cartridge 100 and the socket 200'.

Figure 9:
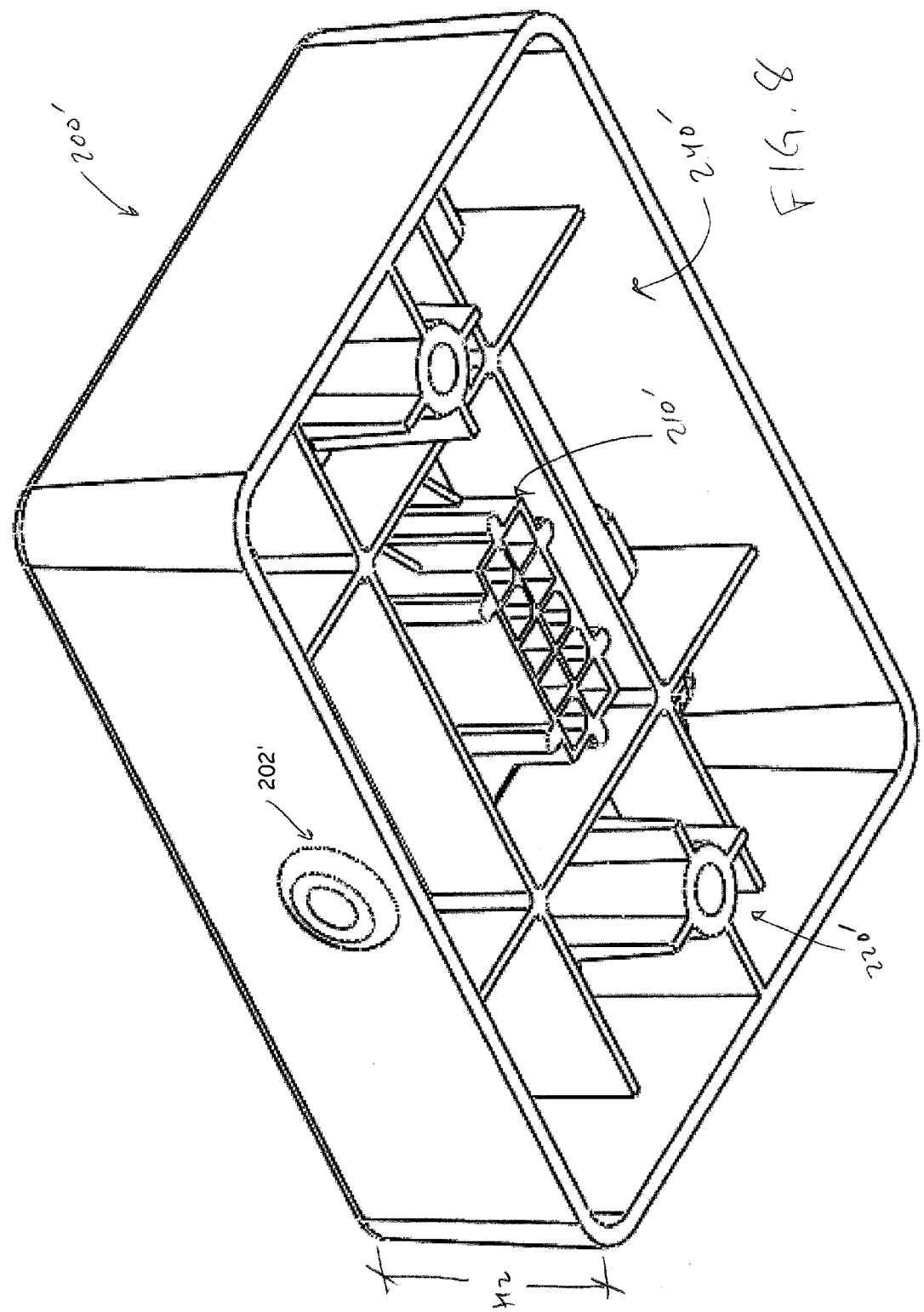
FIG. 9 is a top perspective view of one embodiment of a field replaceable power supply cartridge.

FIGS. 9-11 show one embodiment of the cartridge 100. The cartridge 100 can have one or more gripping members 10 and one or more latches 150 that can be actuated by a user via the gripping members 10. The cartridge can have a top portion 20 attached to a bottom portion 30 with one or more fasteners 40 (e.g., screws). In another embodiment, the top 20 and bottom 30 portions can be attached using an adhesive or other suitable mechanisms (e.g., ultrasonic welding, etc.). The bottom portion 30 can define a key feature 130 and base surface 162. The key feature 130 can include a protruding portion 140 that protrudes from a surface 32 of the bottom portion 30 and defines a first side surface 142, a second side surface 144 opposite the first side surface 142, a third side surface 146 and a fourth side surface 148 opposite the third side surface 146. In the illustrated embodiment, the first and second side surfaces 142, 144 can have the same length and the third and fourth 146 148 side surfaces can have different lengths. The key feature 130 can have the same profile as the key feature 230, 230' of the socket 200, 200' so that the cartridge 100 can be coupled to the socket 200, 200' in only one orientation.

The protruding portion 140 can define a socket portion 160 sized to receive the protruding portion 260, 260' of the socket 200, 200', so that the connector 110 can electrically connect with the connector 210, 210' on the socket 200, 200'. As shown in FIG. 11, the connector 110 can connect to a PCB 120, which can be mounted with one or more fasteners 122 to a socket wall 164 of the socket 160. The top portion 20 of the cartridge 100 can define a cavity 22 therein. As discussed above, the cartridge 100 can provide a plurality of functions, for example, to a lighting assembly with which it is used (e.g., provide a dimming function, power an active cooling system, etc.).

With continued reference to FIG. 11, the one or more gripping members 10 can be integrated with the latch 150 so that each gripping member 10 has a latch 150 and forms a single piece with the latch 150. The gripping member 10 can be spring loaded relative to the top portion 20 of the cartridge 100 by one or more resilient members 50 (e.g., leaf springs) that bias the gripping member 10 outward relative to the housing of the cartridge 100.

In operation, a user would grip the one or more gripping members 10 and pinch them together or squeeze them together or depress to bias the one or more latches 150 inward relative to the cartridge 100 housing (see arrow I in FIG. 11), allowing the one or more latches 150 to clear the one or more recesses 250, 250' of the socket 200, 200' when the cartridge 100 is coupled to the socket 200, 200'. Once the user had properly aligned the key features 130, 230, 230' of the cartridge 100 and socket 200, 200', and advanced the cartridge 100 relative to the socket 200, 200' to provide the electrical connection between the connector 110 of the cartridge 100 and the connector 210, 210' of the socket 200, 200', the user could release the one or more gripping members 10, allowing the latches 150 to be biased outward relative to the cartridge 100 housing by the one or more resilient members 50 (see arrow O in FIG. 11). This outward movement of the one or more latches 150 causes the one or more latches 150 to engage the one or more recesses 250, 250' of the socket 200, 200' to substantially fixedly maintain the cartridge 100 coupled to the socket 200, 200'. To decouple the cartridge 100 from the socket 200, 200', the user can again grip the one or more gripping members 10 on the cartridge 100 and pinch them together or squeeze them together or depress to bias the one or more latches 150 inward so that they can disengage the one or more recesses 250, 250' in the socket 200, 200', thereby allowing the user to remove the cartridge 100 from engagement with the socket 200, 200'.

In another embodiment, the user need not grip the one or more gripping members 10 to bias the one or more latches 150 inward, and can simply advance the cartridge 100 (in the correct orientation) relative to the socket 200, 200', where the one or more latches 150 have an angled surface that allows the one or more latches 150 to be biased inward as the cartridge 100 is advanced relative to the socket 200, 200' so that the one or more latches 150 clear the side walls 246, 246' and 248, 248' to engage the one or more recesses 250, 250'. In still another embodiment, the one or more resilient members 50 can be excluded, and the one or more gripping members 10 can be an integral part (e.g., one piece) with the top portion 20 of the cartridge 100. The cartridge 100 housing can be made of a material that allows some flexion, so that the user can apply a force to the one or more gripping members 10 to bias the one or more latches 150 inward, thereby allowing the one or more latches 150 to clear the side walls 246, 246' and 248, 248' of the socket 200, 200' for engagement and disengagement with the recesses 250, 250' during installation and removal of the cartridge 100.

Figure 13:
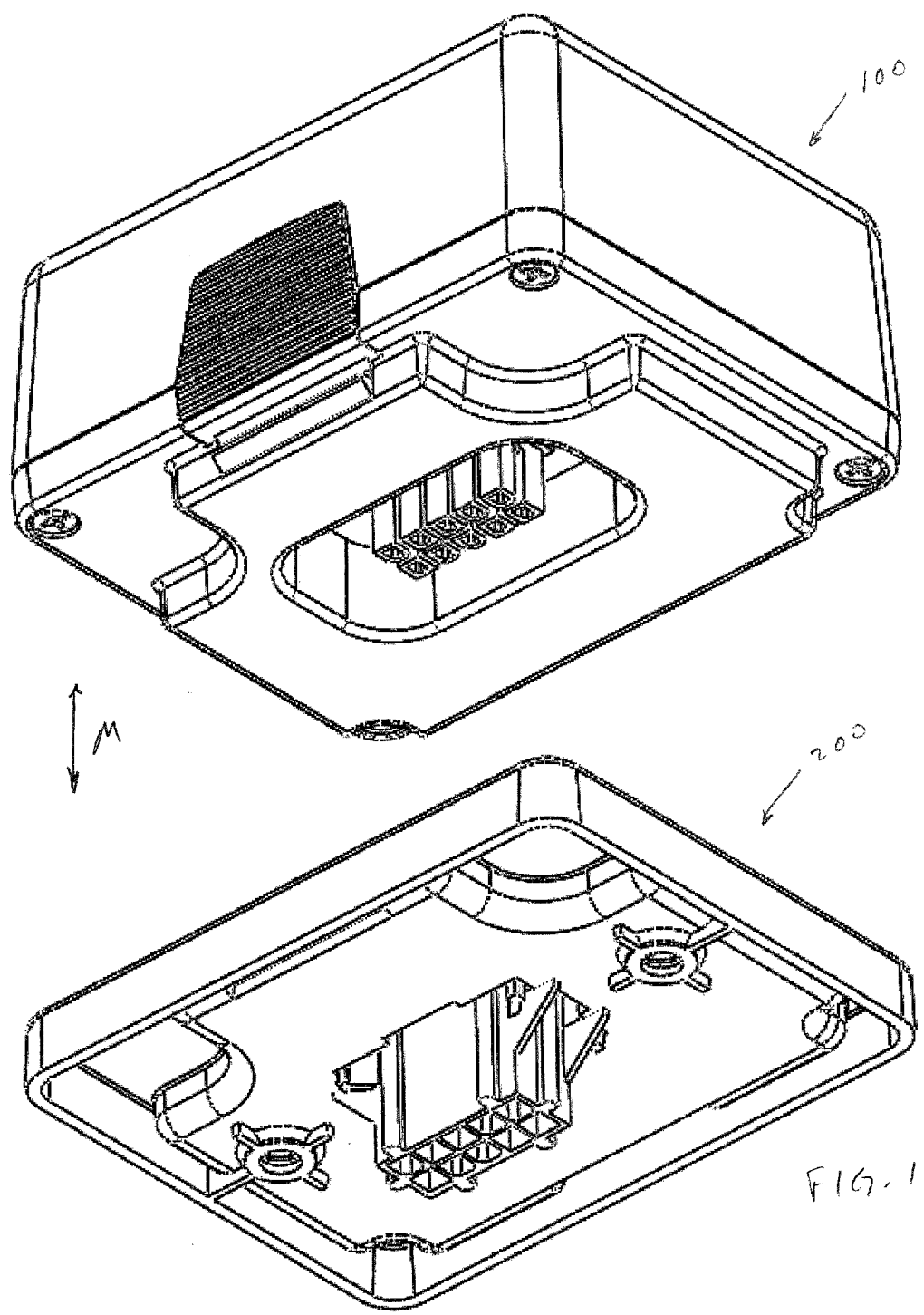
FIG. 13 is a perspective exploded bottom view of the field replaceable power supply cartridge of FIG. 9 and socket of FIGS. 5-6.

FIGS. 12 and 13 show an exploded view of the cartridge 100 and socket 200, and the motion of the cartridge 100 relative to the socket 200 (see arrow M) to couple the cartridge 100 to the socket 200.

Advantageously, the cartridge 100 and socket 200, 200' system disclosed herein elegantly simplifies the process of replacing a power supply cartridge, which can be done by a user without any tools, without the need to cut or strip electrical wires when replacing the cartridge, and without the need to keep track of fasteners that need to be removed or replaced to replace the power supply. Additionally, the cartridge 100 and socket 200, 200' allow the user to easily replace the power supply (e.g., in a down lighting system) where space to the electrical components of the lighting system is very limited.

Of course, the foregoing description is that of certain features, aspects and advantages of the present invention, to which various changes and modifications can be made without departing from the spirit and scope of the present invention. Moreover, the field replaceable power supply cartridge need not feature all of the objects, advantages, features and aspects discussed above. Thus, for example, those skilled in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. For example, the embodiments of the field replaceable power supply cartridge discussed above can be used with many different types of lighting assemblies or form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc. It is contemplated that various combinations or subcombinations of the specific features and aspects between and among the different embodiments may be made and still fall within the scope of the invention. Accordingly, it should be understood that various features and aspects of the disclosed embodiments can be combined with or substituted for one another in order to form varying modes of the discussed field replaceable power supply cartridge.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, 0.1 degree, or otherwise.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A field replaceable LED driver system, comprising:
   an LED driver cartridge body, the cartridge body having a key feature defined on a bottom side of the cartridge body;
   one or more gripping members spring loaded relative to a portion of the cartridge body, the one or more ripping members configured to actuate one or more latches and configured to be pushed by a user to move the one or more latches inward relative to the cartridge body;
   an electrical connector on the bottom side of the cartridge body;
   a socket having a socket body coupleable to an electrical box and configured to releasably couple to the cartridge body, the socket body comprising one or more recess portions configured to releasably engage the one or more latches, the socket body having a key portion defined on a top side thereof, the key portion having a shape corresponding to a shape of the key feature such that the LED driver cartridge body couples to the socket in a single predetermined orientation, wherein the key feature of the cartridge body and the key portion of the socket facilitate coupling of the LED driver cartridge body to the socket body in the single predetermined orientation.

2. The system of claim 1, further comprising a printed circuit board coupled to the cartridge body, the printed circuit board connected to the electrical connector.

3. The system of claim 2, wherein the key feature comprises a protruding portion that protrudes from a bottom surface of the cartridge body and the key portion comprises a recessed portion on the top side of the socket body.

4. The system of claim 3, wherein the protruding portion defines a socket opening into which the electrical connector at least partially extends.

5. The system of claim 4, wherein the electrical connector comprises a multi-pin electrical connector.

6. The system of claim 1, wherein the socket comprises another electrical connector on said top side of the socket body, the another electrical connector configured to connect to the electrical connector of the cartridge body when the LED driver cartridge body is coupled to the socket body.

7. The system of claim 6, wherein the socket comprises an opening on a side surface of the socket body configured to receive one or more electrical wires therethrough into an inner space of the socket body, said one or more electrical wires connectable to said another electrical connector of the socket.

8. The system of claim 1, wherein a surface of the LED driver cartridge body is configured to contact a surface of the socket body when the cartridge body is coupled to the socket body to thereby transfer heat from the LED driver cartridge to the socket.

9. The system of claim 1, wherein the key feature comprises a first side surface, a second side surface opposite the first side surface, a third side surface and a fourth side surface opposite the third side surface, wherein the first and second side surfaces have the same length and the third and fourth side surfaces have different lengths.

10. The system of claim 1, wherein the key portion is defined by a first side wall, a second side wall opposite the first side wall, a third side wall and a fourth side wall opposite the third side wall, wherein the first and second side walls have the same length and the third and fourth side walls have different lengths.

11. A field replaceable LED driver system, comprising:
an LED driver cartridge body, the cartridge body having a key feature defined on a bottom side of the cartridge body;
one or more gripping members being flexible relative to a portion of the cartridge body, the one or more gripping members configured to actuate one or more latches and configured to be pushed by a user to move the one or more latches inward relative to the cartridge body;
an electrical connector on the bottom side of the cartridge body;
a socket having a socket body coupleable to electrical wires and configured to releasably couple to the cartridge body, the socket body comprising one or more recess portions configured to releasably engage the one or more latches, the socket body having a key portion defined on a top side thereof, the key portion having a shape corresponding to a shape of the key feature such that the LED driver cartridge body couples to the socket in a single predetermined orientation, wherein the key feature of the cartridge body and the key portion of the socket facilitate coupling of the LED driver cartridge body to the socket body in the single predetermined orientation.

12. The system of claim 11, wherein the one or more gripping members are spring loaded relative to the portion of the cartridge body.

13. The system of claim 11, wherein the socket body is coupleable to an electrical box, and wherein the electrical wires are bottom fed into the socket.

14. The system of claim 11, further comprising a printed circuit board coupled to the cartridge body, the printed circuit board connected to the electrical connector.

15. The system of claim 11, wherein the key feature comprises a protruding portion that protrudes from a bottom surface of the cartridge body and the key portion comprises a recessed portion on the top side of the socket body.

16. The system of claim 15, wherein the protruding portion defines a socket opening into which the electrical connector at least partially extends.

17. The system of claim 11, wherein the socket comprises another electrical connector on said top side of the socket body, the another electrical connector configured to connect to the electrical connector of the cartridge body when the LED driver cartridge body is coupled to the socket body.

18. The system of claim 17, wherein the socket comprises an opening on a side surface of the socket body configured to receive one or more electrical wires therethrough into an inner space of the socket body, said one or more electrical wires connectable to said another electrical connector of the socket.

19. The system of claim 11, wherein a surface of the LED driver cartridge body is configured to contact a surface of the socket body when the cartridge body is coupled to the socket body to thereby transfer heat from the LED driver cartridge to the socket.

20. The system of claim 11, wherein the key feature comprises a first side surface, a second side surface opposite the first side surface, a third side surface and a fourth side surface opposite the third side surface, wherein the first and second side surfaces have the same length and the third and fourth side surfaces have different lengths.

21. The system of claim 11, wherein the key portion is defined by a first side wall, a second side wall opposite the first side wall, a third side wall and a fourth side wall opposite the third side wall, wherein the first and second side walls have the same length and the third and fourth side walls have different lengths.

22. A field replaceable LED driver system, comprising:
an LED driver cartridge body including a bottom side having an electrical connector, the cartridge body also including one or more gripping members being flexible relative to a portion of the cartridge body, the cartridge body further including one or more latches;
a key feature being defined on the bottom side of the cartridge body, the key feature having a shape being in correspondence with another shape of a key portion defined on a top side of a socket body being coupleable to electrical wires, the correspondence of the shape and the another shape facilitating releasable coupling of the cartridge body to such a socket body in a single predetermined orientation;
the one or more gripping members of the cartridge body being configured to be pushed by a user to actuate the one or more latches by moving the latches inward relative to the cartridge body, the one or more latches being configured to releasably engage one or more recess portions of such a socket body.

23. The system of claim 22, wherein the key feature includes a protruding portion that protrudes from a bottom surface of the cartridge body.

24. The system of claim 23, wherein the protruding portion is in correspondence with a recessed portion of the key portion of such a socket body.

25. The system of claim 23, wherein the protruding portion defines a socket opening into which the electrical connector at least partially extends.

26. The system of claim 25, wherein the key feature includes a first side surface, a second side surface opposite the first side surface, a third side surface and a fourth side surface opposite the third side surface, wherein the first and second side surfaces have the same length and the third and fourth side surfaces have different lengths.

27. The system of claim 26, wherein the one or more gripping members are spring loaded relative to the portion of the cartridge body.

* * * * *